(12) United States Patent
Sano et al.

(10) Patent No.: US 9,412,584 B2
(45) Date of Patent: Aug. 9, 2016

(54) METHOD OF MANUFACTURING A THIN FILM HAVING A HIGH TOLERANCE TO ETCHING AND NON-TRANSITORY COMPUTER-READABLE RECORDING MEDIUM

(71) Applicant: Hitachi Kokusai Electric Inc., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/274,411

(22) Filed: May 9, 2014

(65) Prior Publication Data

US 2014/0335701 A1   Nov. 13, 2014

(30) Foreign Application Priority Data

May 10, 2013   (JP) ................................ 2013-100582

(51) Int. Cl.
*H01L 21/02* (2006.01)
*C23C 16/34* (2006.01)
*C23C 16/36* (2006.01)
*C23C 16/455* (2006.01)

(52) U.S. Cl.
CPC .......... *H01L 21/0228* (2013.01); *C23C 16/342* (2013.01); *C23C 16/36* (2013.01); *C23C 16/45542* (2013.01); *C23C 16/45553* (2013.01); *H01L 21/02112* (2013.01); *H01L 21/02274* (2013.01)

(58) Field of Classification Search
CPC ..................... H01L 21/0228; H01L 21/02112; H01L 21/02274; C23C 16/45553; C23C 16/36; C23C 16/45542; C23C 16/342
See application file for complete search history.

(56) References Cited

U.S. PATENT DOCUMENTS

| 6,383,465 B1 * | 5/2002 | Matsumoto | ........... C01B 21/064 423/290 |
| 2008/0292798 A1 * | 11/2008 | Huh | ...................... C23C 16/342 427/343 |
| 2010/0181654 A1 * | 7/2010 | Fujiwara | ............... C23C 16/342 257/632 |
| 2012/0088030 A1 * | 4/2012 | Kato | ................. C23C 16/45551 427/255.5 |
| 2014/0287597 A1 * | 9/2014 | Hirose | ............. H01L 21/02172 438/786 |

FOREIGN PATENT DOCUMENTS

| JP | 2007-324536 A | 12/2007 |
| JP | 2009-065203 A | 3/2009 |
| JP | 2011-192720 A | 9/2011 |
| KR | 10-2010-0022472 A | 3/2010 |
| KR | 10-2011-0008209 A | 1/2011 |
| WO | 2009137199 A2 | 11/2009 |

* cited by examiner

*Primary Examiner* — Mohammad Islam
*Assistant Examiner* — Christina Sylvia
(74) *Attorney, Agent, or Firm* — Volpe and Koening, P.C.

(57) ABSTRACT

A thin film containing boron and a borazine ring structure is formed on a substrate by performing a cycle a predetermined number of times under a condition where the borazine ring structure is preserved in a borazine compound. The cycle includes: supplying a source gas containing boron and a halogen element to the substrate; and supplying a reactive gas including a borazine compound to the substrate.

16 Claims, 25 Drawing Sheets

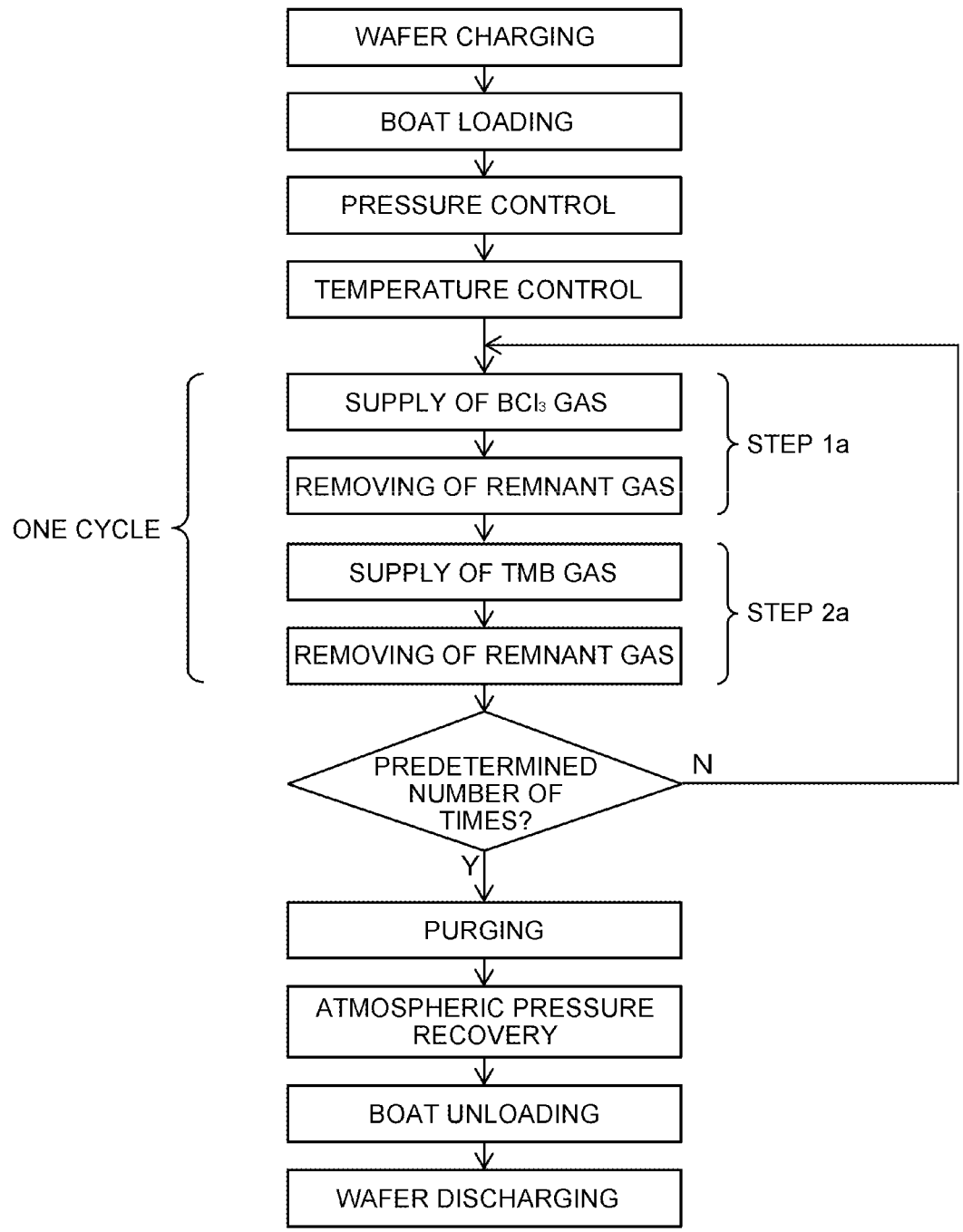

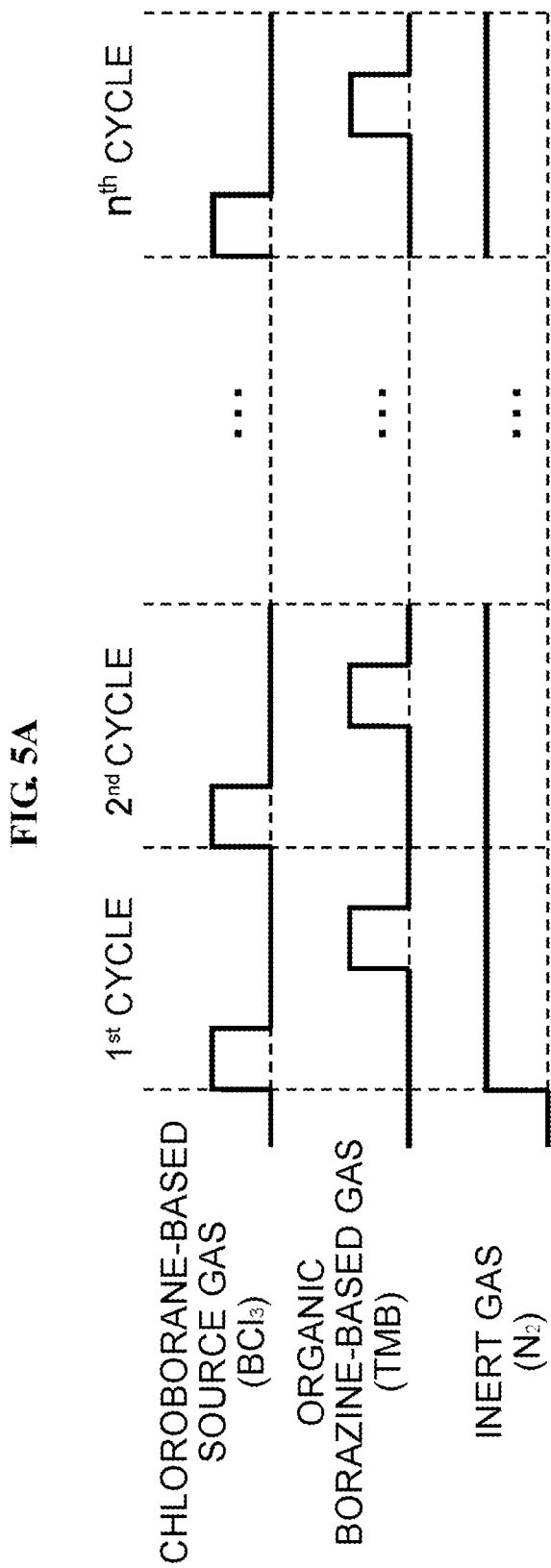

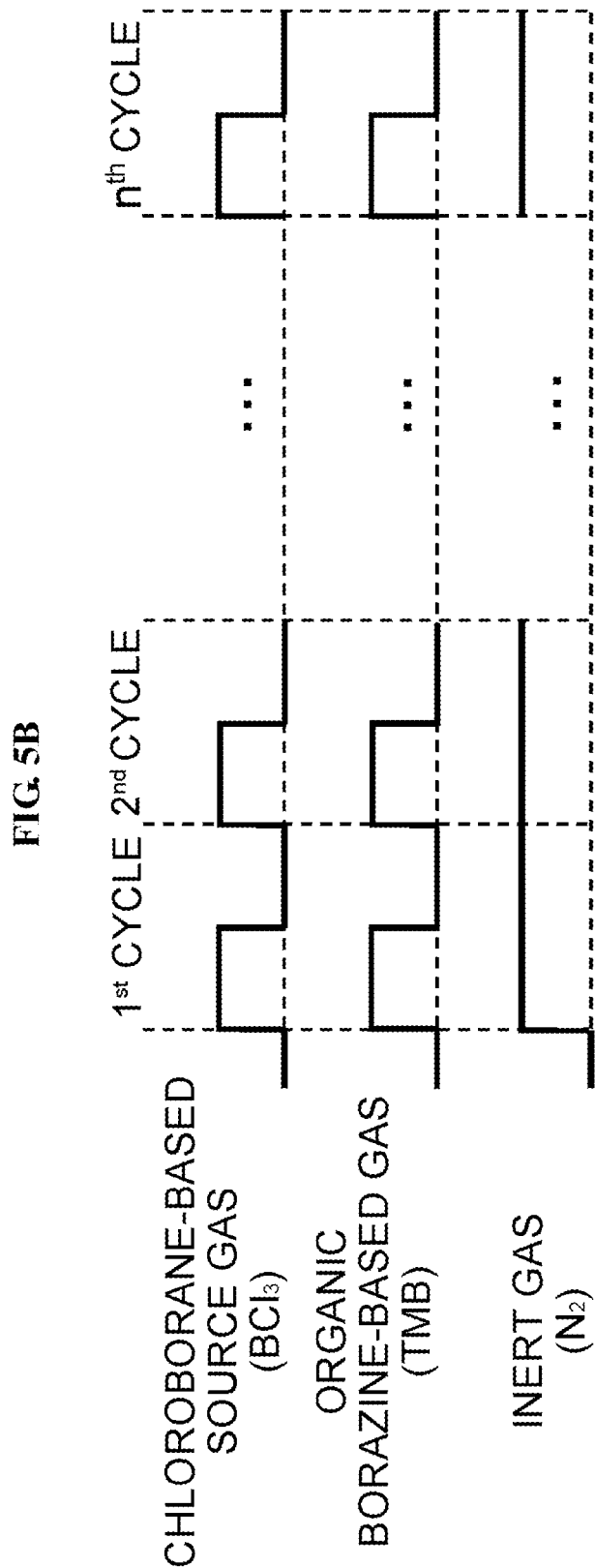

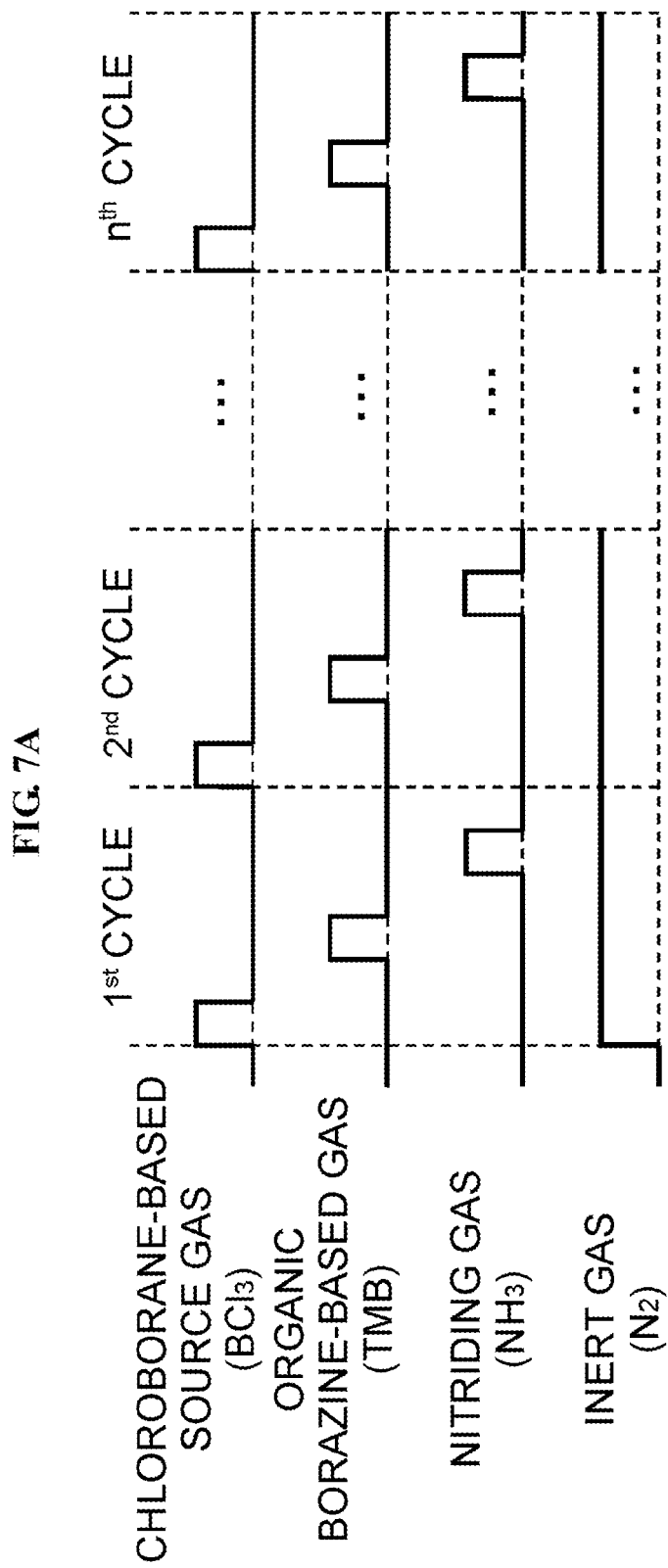

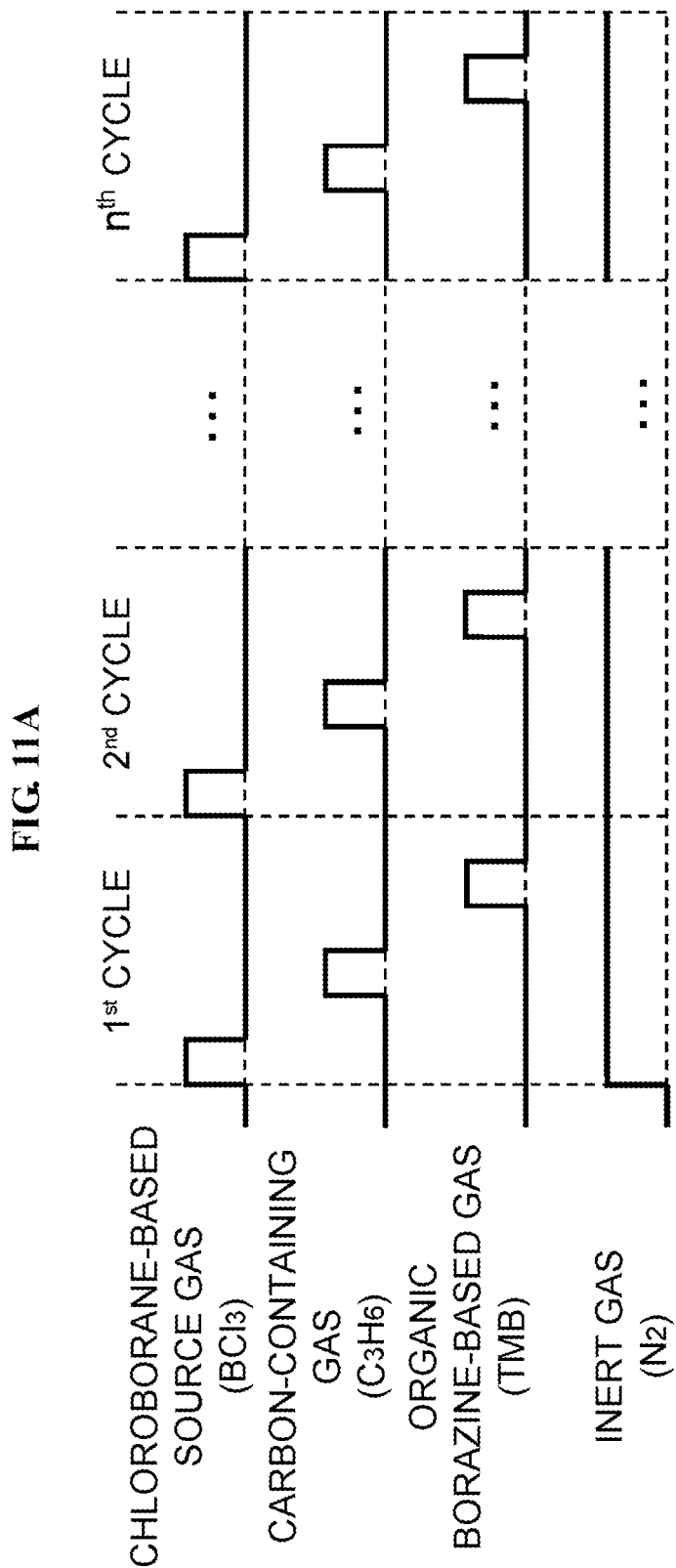

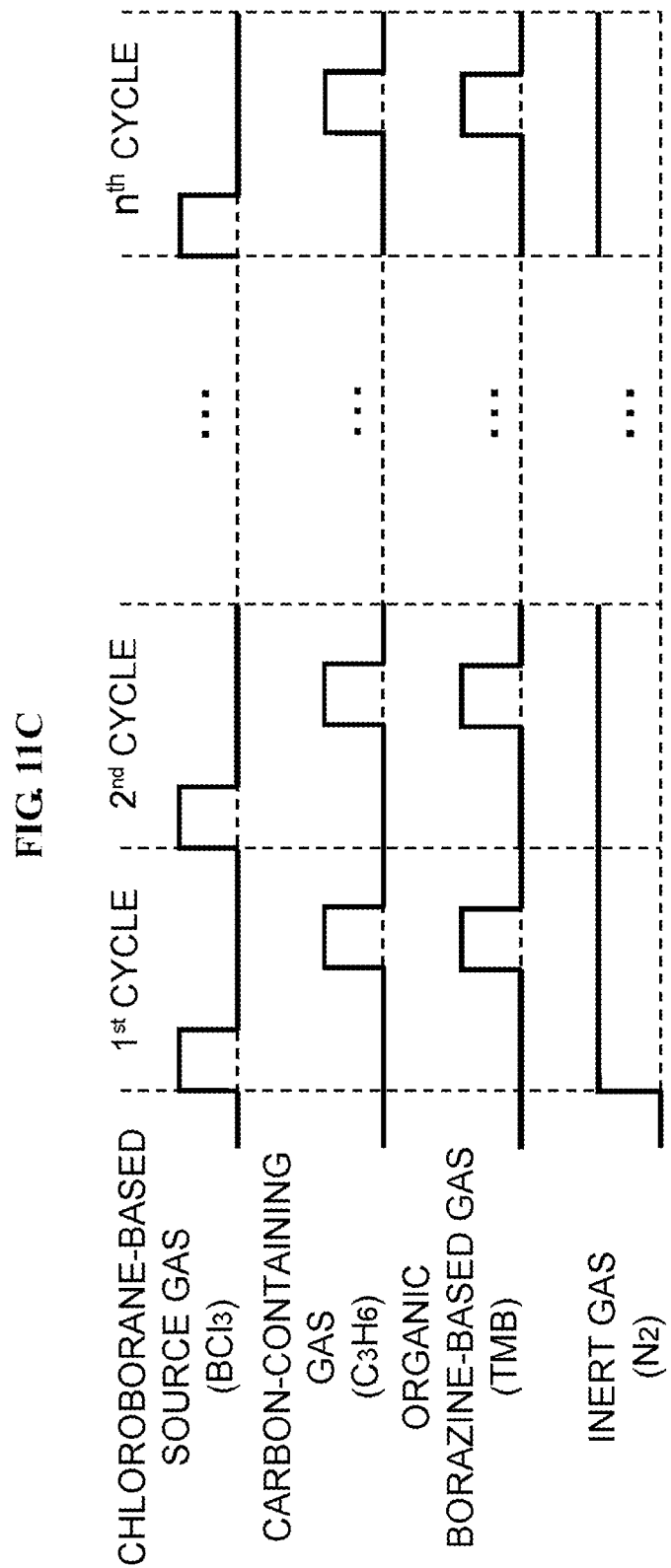

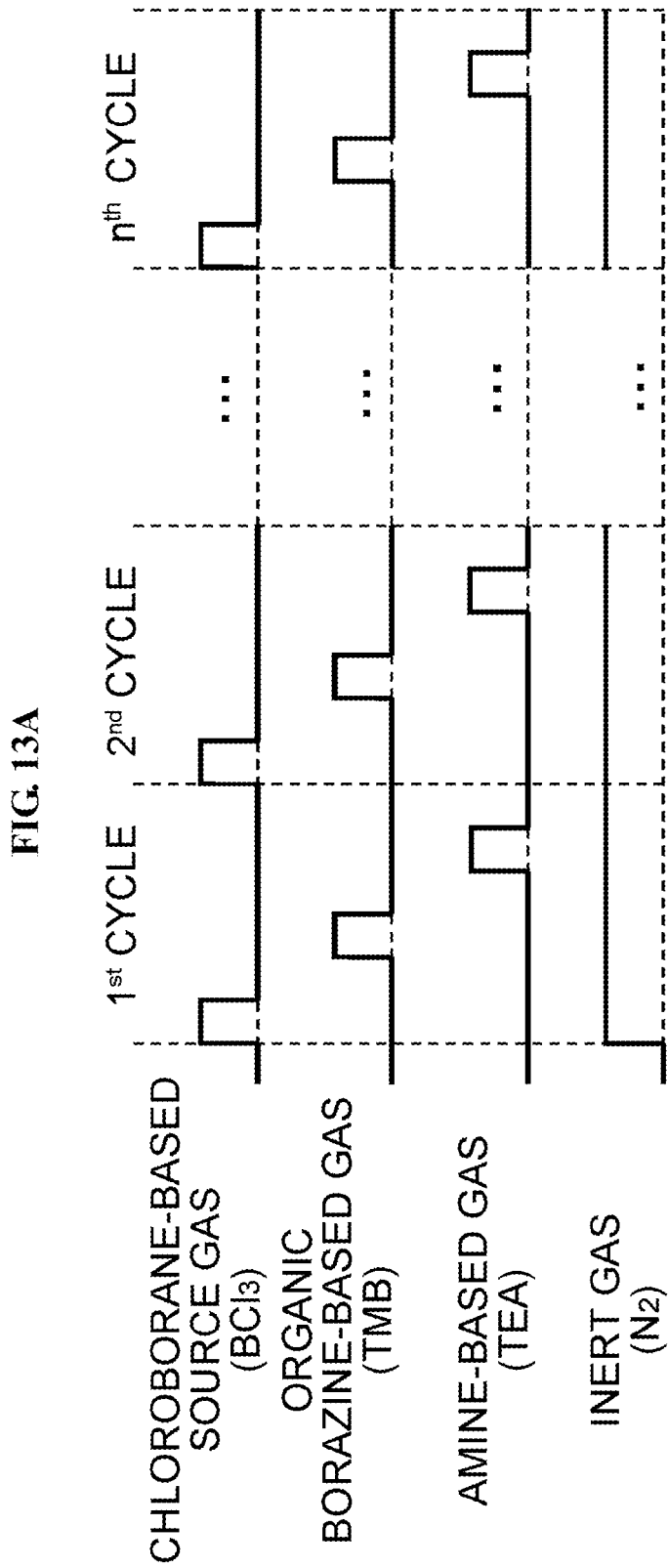

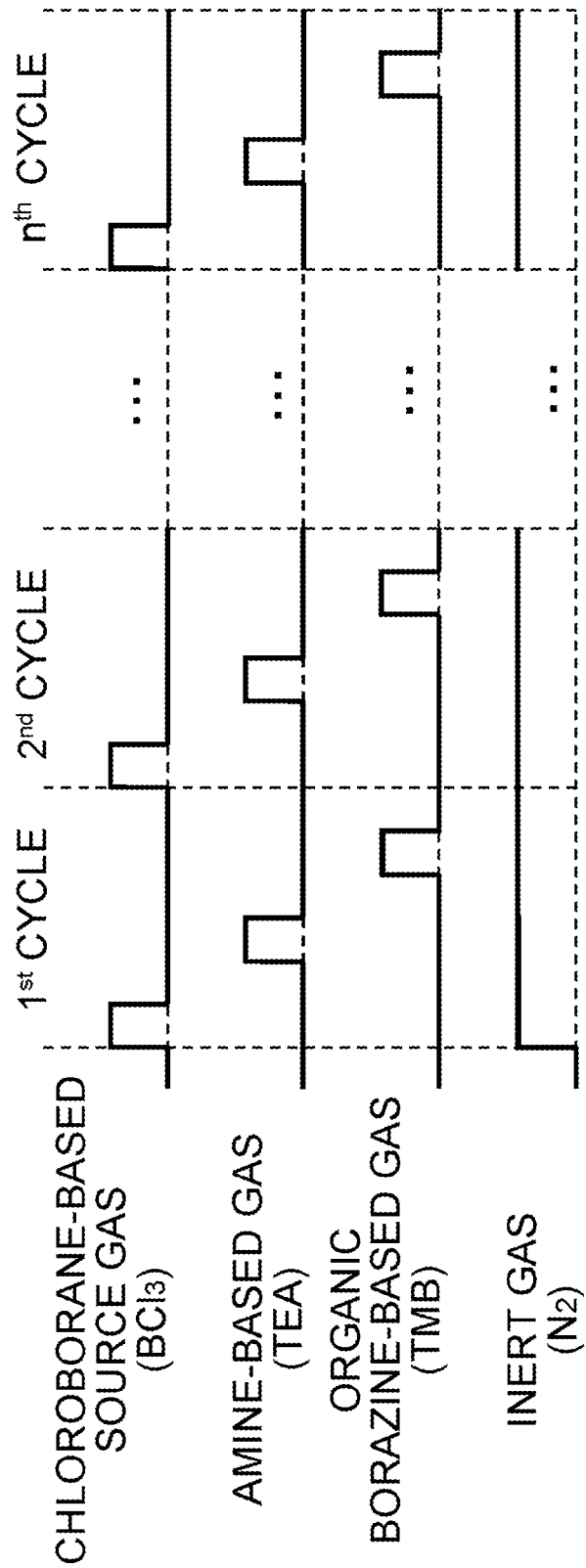

METHOD OF MANUFACTURING A THIN FILM HAVING A HIGH TOLERANCE TO ETCHING AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2013-100582 filed on May 10, 2013 in the Japanese Patent Office, the entire contents of which are hereby incorporated by reference.

BACKGROUND OF THE INVENTION

1. Field of the Invention

The present invention relates to a method of manufacturing a semiconductor device including a process of forming a thin film on a substrate, a substrate processing apparatus, and a non-transitory computer-readable recording medium.

2. Description of the Related Art

With miniaturization of transistors, a thin film, such as an insulating film, constituting sidewall spacers (SWS) of a gate electrode, has been increasingly required to be formed at a low temperature and have a lower dielectric constant and a higher tolerance to hydrogen fluoride (HF). Therefore, adopting a boron carbon nitride (BCN) film or a boron nitride (BN) film as the insulating film has been considered.

SUMMARY OF THE INVENTION

Since the insulating film described above needs high step coverage characteristics (step coverage), there have been many cases in which the insulating film is formed using an alternate supply method of alternately supplying a plurality of kinds of process gases. For example, a BCN film may be formed on a substrate by performing, a predetermined number of times, a cycle including sequentially supplying boron trichloride ($BCl_3$) gas or diborane ($B_2H_6$) gas as a boron source (boron source), ammonia ($NH_3$) gas as a nitrogen source (nitrogen source), and ethylene ($C_2H_4$) gas or propylene ($C_3H_6$) gas as a carbon source (carbon source) to the substrate. However, in the above-described method of separately supplying the boron source, the nitrogen source, and the carbon source, there have been cases in which a time required per cycle is increased to lower film forming throughput. Also, in the above-described method, it was difficult to increase a boron (B) concentration or carbon (C) concentration in the BCN film and thus it was difficult to improve a tolerance to HF.

It is a main object of the present invention to form a thin film having a high tolerance to hydrogen fluoride (HF) and a low dielectric constant in a low-temperature region with high throughput.

According to one aspect of the present invention, there is provided a method of manufacturing a semiconductor device, including forming a thin film containing boron and a borazine ring structure on a substrate by performing a cycle a predetermined number of times under a condition where the borazine ring structure is preserved in a borazine compound, the cycle including: (a) supplying a source gas containing boron and a halogen element to the substrate; and (b) supplying a reactive gas including the borazine compound to the substrate.

According to another aspect of the present invention, there is provided a substrate processing apparatus including: a process chamber configured to accommodate a substrate; a source gas supply system configured to supply a source gas containing boron and a halogen element into the process chamber; a reactive gas supply system configured to supply a reactive gas including a borazine compound into the process chamber; a heater configured to heat the substrate in the process chamber; a pressure regulator configured to regulate an inside pressure of the process chamber; and a control unit configured to control the source gas supply system, the reactive gas supply system, the heater and the pressure regulator to form a thin film containing boron and a borazine ring structure on the substrate by performing a cycle a predetermined number of times under a condition where the borazine ring structure is preserved in the borazine compound, the cycle including supplying the source gas to the substrate in the process chamber and supplying the reactive gas to the substrate in the process chamber.

According to another aspect of the present invention, there is provided a non-transitory computer-readable recording medium storing a program for causing a computer to perform forming a thin film containing boron and a borazine ring structure on a substrate by performing a cycle a predetermined number of times under a condition where the borazine ring structure is preserved in a borazine compound, the cycle including: (a) supplying a source gas containing boron and a halogen element to the substrate in a process chamber; and (b) supplying a reactive gas including the borazine compound to the substrate in the process chamber.

BRIEF DESCRIPTION OF THE DRAWINGS

FIG. 4 is a flowchart of a film forming process in a film forming sequence of a first embodiment.

FIG. 5A is a timing chart illustrating gas supply timing in the film forming sequence of the first embodiment, and FIG. 5B and FIG. 5C illustrate modified examples of the timing chart of FIG. 5A.

FIG. 7 is a timing chart illustrating gas supply timing and plasma power supply timing in the first sequence of the second embodiment. FIG. 7A illustrates an example of a sequence of forming a film using a non-plasma process.

FIG. 9 is a timing chart illustrating gas supply timing and plasma power supply timing in the second sequence of the second embodiment.

FIG. 11A is a timing chart illustrating gas supply timing in the film forming sequence of the third embodiment, and FIG. 11B and FIG. 11C illustrate modified examples of the timing chart of FIG. 11A.

FIG. 13A is a timing chart illustrating gas supply timing in the first sequence of the fourth embodiment, and FIG. 13B illustrates a modified example of the timing chart of FIG. 13A.

DETAILED DESCRIPTION OF THE PREFERRED EMBODIMENTS

One Embodiment of the Present Invention

One embodiment of the present invention will now be described with reference to FIGS. 1 through 3.

(1) Structure of Substrate Processing Apparatus

Figure 1:
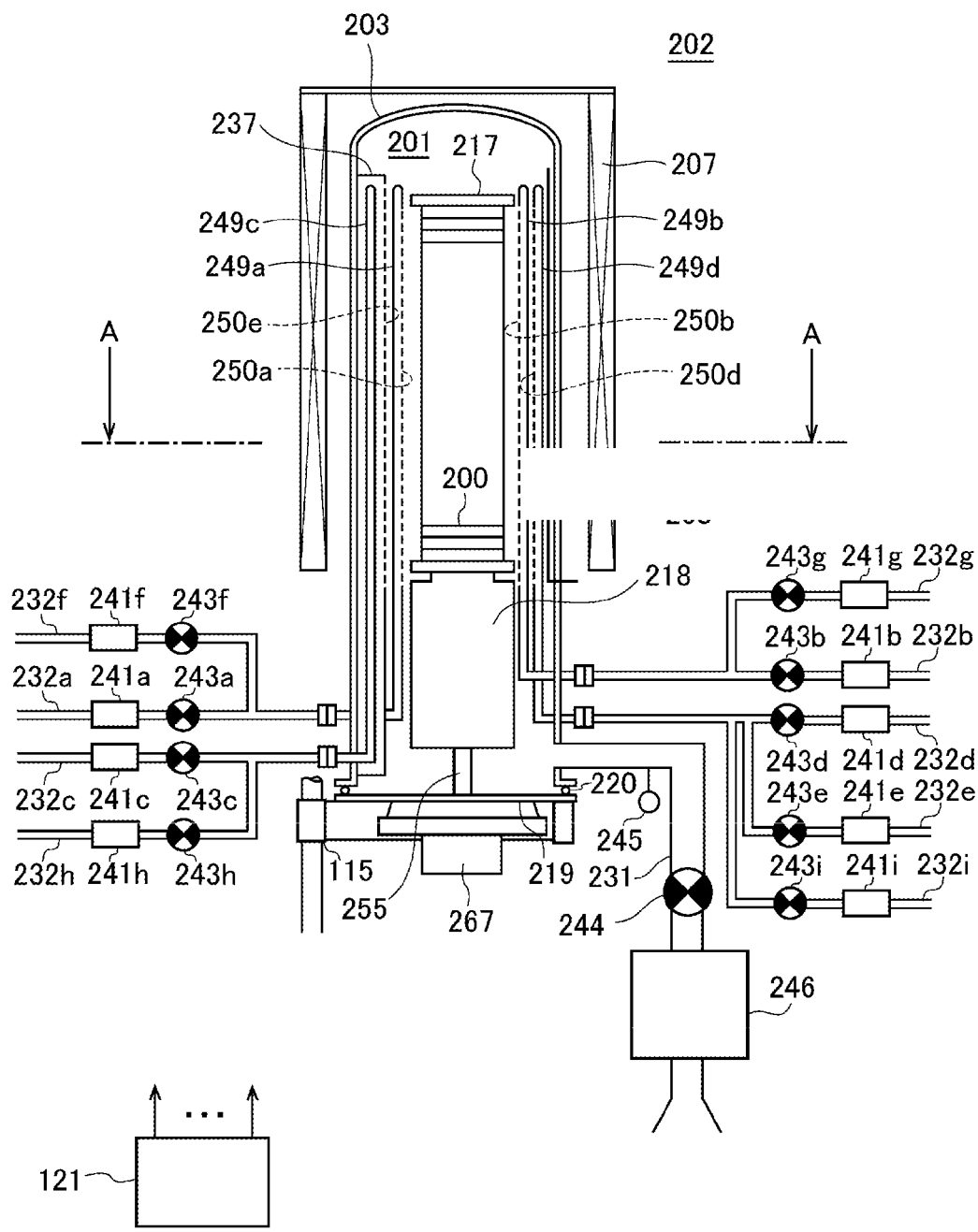
FIG. 1 is a schematic configuration diagram of a longitudinal process furnace of a substrate processing apparatus preferably used in an exemplary embodiment of the present invention, in which a longitudinal sectional view of a portion of the process furnace is illustrated.

As illustrated in FIG. 1, a process furnace 202 includes a heater 207 serving as a heating unit. The heater 207 has a cylindrical shape and is vertically installed by being supported by a heater base (not shown) serving as a retaining plate. Also, the heater 207 acts as an activating mechanism (excitation unit) that activates a gas by heat as will be described below.

In the heater 207, a reaction tube 203 forming a reaction container (process container) in a concentric shape with the heater 207 is provided. The reaction tube 203 is formed of a heat-resistant material, e.g., quartz ($SiO_2$) or silicon carbide (SiC), and has a cylindrical shape, an upper end of which is closed and a lower end of which is open. A process chamber 201 is formed in a hollow tubular portion of the reaction tube 203, and configured to accommodate wafers 200 serving as substrates such that the wafers 200 are vertically arranged in a horizontal posture and in multiple stages using a boat 217 which will be described below.

In the process chamber 201, nozzles 249a to 249d are installed to pass through lower sidewalls of the reaction tube 203. Gas supply pipes 232a to 232d are connected to the nozzles 249a to 249d, respectively. A gas supply pipe 232e is connected to the gas supply pipe 232d. As described above, the reaction tube 203 is configured to install the four nozzles 249a to 249d and the five gas supply pipes 232a to 232e therein and to supply a plurality of gases (here, five types of gases) into the process chamber 201.

Also, a manifold formed of a metal may be installed below the reaction tube 203 to support the reaction tube 203, and the first through fourth nozzles 249a to 249d may be installed to pass through sidewalls of the manifold. In this case, an exhaust pipe 231 which will be described below may be installed in the manifold. Alternatively, the exhaust pipe 231 may be installed below the reaction tube 203 rather than in the manifold. As described above, a furnace port portion of the process furnace 202 may be formed of a metal and the nozzles 249a to 249d may be installed at the furnace port portion formed of a metal.

Mass flow controllers (MFCs) 241a to 241e which are flow rate control devices (flow rate control units) and valves 243a to 243e which are opening/closing valves are sequentially installed at the gas supply pipes 232a to 232e in an upstream direction. Gas supply pipes 232f to 232i configured to supply an inert gas are respectively connected to the gas supply pipes 232a to 232d at downstream sides of the valves 243a to 243d. MFCs 241f to 241i which are flow rate control devices (flow rate control units) and valves 243f to 243i which are opening/closing valves are sequentially installed at the gas supply pipes 232f to 232i, respectively, in the upstream direction.

The nozzles 249a, 249b, and 249d described above are respectively connected to front end portions of the gas supply pipes 232a, 232b, and 232d. As illustrated in FIG. 2, each of the nozzles 249a, 249b, and 249d is installed in an arc-shaped space between inner walls of the reaction tube 203 and the wafers 200 to move upward from lower inner walls of the reaction tube 203 in a direction in which the wafers 200 are stacked. In other words, each of the nozzles 249a, 249b, and 249d is installed along a wafer arrangement region in which the wafers 200 are arranged, in a region that horizontally surrounds the wafer arrangement region at sides of the wafer arrangement region. Each of the nozzles 249a, 249b, and 249d is configured as an L-shaped long nozzle, and includes a horizontal portion passing through lower sidewalls of the reaction tube 203 and a vertical portion vertically moving at least from one end of the wafer arrangement region toward the other end thereof. Gas supply holes 250a, 250b, and 250d are formed in side surfaces of the nozzles 249a, 249b, and 249d to supply a gas. The gas supply holes 250a, 250b, and 250d open toward a center of the reaction tube 203 to supply gases toward the wafers 200. The gas supply holes 250a, 250b, and 250d are formed from a lower portion of the reaction tube 203 to an upper portion thereof and each have the same opening area at the same opening pitch.

The nozzle 249c described above is connected to a front end portion of the gas supply pipe 232c. The nozzle 249c is installed in a buffer chamber 237 which is a gas dispersing space. As illustrated in FIG. 2, the buffer chamber 237 is installed in an arc-shaped space between inner walls of the reaction tube 203 and the wafers 200 to move upward from lower inner walls of the reaction tube 203 in a direction in which the wafers 200 are stacked. In other words, the buffer chamber 237 is installed along the wafer arrangement region in a region that horizontally surrounds the wafer arrangement region at sides of the wafer arrangement region. A plurality of gas supply holes 250e are installed at an end portion of a wall of the buffer chamber 237 adjacent to the wafers 200 to supply a gas. The gas supply holes 250e open toward the center of the reaction tube 203 to supply a gas toward the wafers 200. The gas supply holes 250e are formed from the lower portion of the reaction tube 203 to the upper portion thereof and each have the same opening area at the same opening pitch.

The nozzle 249c is installed at an end portion of the wall of the buffer chamber 237, which is opposite to the end portion at which the gas supply hole 240e is installed, to move upward from the lower inner walls of the reaction tube 203 in the direction in which the wafers 200 are stacked. In other words, the nozzle 249c is installed along the wafer arrangement region in a region that horizontally surrounds the wafer arrangement region at sides of the wafer arrangement region.

The nozzle 249c is configured as an L-shaped long nozzle, and includes a horizontal portion passing through lower sidewalls of the reaction tube 203 and a vertical portion vertically moving at least from one end of the wafer arrangement region toward the other end thereof. A plurality of gas supply holes 250c are formed in a side surface of the nozzle 249c to supply a gas. The gas supply holes 250c open toward the center of the buffer chamber 237. Similar to the gas supply holes 250e, the gas supply holes 250c are formed from the lower portion of the reaction tube 203 to the upper portion thereof. When a difference in pressure between the inside of the buffer chamber 237 and the inside of the process chamber 201 is small, the gas supply holes 250c may be installed from an upstream side (a lower portion) to a downstream side (an upper portion) to have the same opening area at the same opening pitch. However, when the difference in pressure between the inside of the buffer chamber 237 and the inside of the process chamber 201 is great, the gas supply holes 250c may be installed from the upstream side to the downstream side to have gradually increasing opening areas or gradually decreasing opening pitches.

In the present embodiment, by controlling the opening area or opening pitch of each of the gas supply holes 250c from an upstream side to a downstream side as described above, gases having different flow velocities and about the same flow rates are respectively emitted from the gas supply holes 250c. The gases emitted from the respective gas supply holes 250c are then introduced into the buffer chamber 237, and differences in flow velocity are uniformized in the buffer chamber 237. In other words, particle velocities of the gases emitted from the respective gas supply holes 250c into the buffer chamber 237 are reduced in the buffer chamber 237 and emitted from the plurality of gas supply holes 250e into the process chamber 201. Thus, the gases emitted from the respective gas supply holes 250c into the buffer chamber 237 become gases having uniform flow rates and flow velocities when the gases are emitted from the respective gas supply holes 250e into the process chamber 201.

As described above, in a method of supplying gases using long nozzles according to the present embodiment, a gas is transferred via the nozzles 249a to 249d and the buffer chamber 237 arranged in a vertically long arc-shaped space (i.e., a cylindrical space) defined with the inner walls of the reaction tube 203 and end portions of the stacked wafers 200, a gas is first emitted into the reaction tube 203 near the wafers 200 from the gas supply holes 250a to 250e opened in the nozzles 249a to 249d and the buffer chamber 237, respectively, and a gas flows mainly in the reaction tube 203 to be parallel with surfaces of the wafers 200, i.e., in a horizontal direction. Due to the above-described configuration, gases may be uniformly supplied to the respective wafers 200 so that thicknesses of thin films formed on the respective wafers 200 can be uniformized. Also, gases supplied to the surfaces of the wafers 200, i.e., remnant gases remaining after a reaction, flow in a direction of an exhaust mechanism, i.e., the exhaust pipe 231 which will be described below, but the direction in which the remnant gases flow may be appropriately defined according to the location of the exhaust mechanism and is not limited to the vertical direction.

A source gas containing boron (B) and a halogen element, for example, a chloroborane-based source gas which is a source gas containing at least boron (B) and chlorine (Cl), is supplied from the gas supply pipe 232a into the process chamber 201 via the MFC 241a, the valve 243a, and the nozzle 249a.

Here, the chloroborane-based source gas means a gaseous chloroborane-based source, e.g., a gas obtained by vaporizing a chloroborane-based source that is in a liquid state at normal temperature and pressure, or a chloroborane-based source that is in a gas state at normal temperature and pressure. Also, the chloroborane-based source is a borane-based source containing a chloro group as a halogen group, and means a source containing at least boron (B) and chlorine (Cl). Here, the chloroborane-based source may be understood as a type of halide. The borane-based source is not limited to a source containing a borane (boron hydride), such as monoborane ($BH_3$) or diborane ($B_2H_6$), but refers collectively to a source containing a borane compound (borane derivative) in which a hydrogen (H) atom of a borane is substituted with another element. Also, when the term 'source' is used in the present disclosure, it may be understood as a liquid source in a liquid state, a source gas in a gas state, or both of them. Thus, when the term 'chloroborane-based source' is used in the present disclosure, it may be understood as a chloroborane-based source in a liquid state, a chloroborane-based source in a gas state, or both of them. For example, boron trichloride ($BCl_3$) may be used as the chloroborane-based source. Since $BCl_3$ is in a gas state at normal temperature and pressure, the $BCl_3$ is not vaporized using a vaporization system such as a vaporizer or a bubbler but may be supplied as a source gas ($BCl_3$ gas). In contrast, when a liquid source which is in a liquid state at normal temperature and pressure is used, the liquid source is vaporized using the vaporization system such as the vaporizer or the bubbler and supplied as a source gas.

A reactive gas containing a borazine compound, e.g., a reactive gas containing an alkylborazine compound which is an organic borazine compound, i.e., an organic borazine-based gas (borazine-based gas), is supplied from the gas supply pipe 232b into the process chamber 201 via the MFC 241b, the valve 243b, and the nozzle 249b.

Figure 16A:
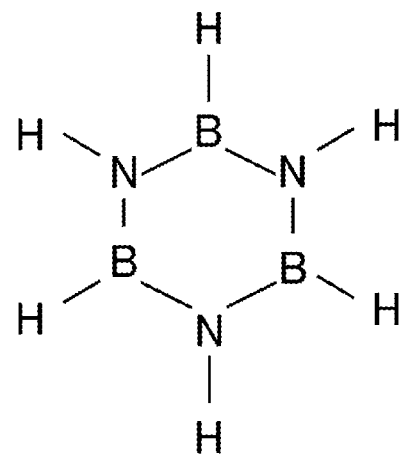
FIG. 16A illustrates a chemical formula of borazine.
Figure 16B:
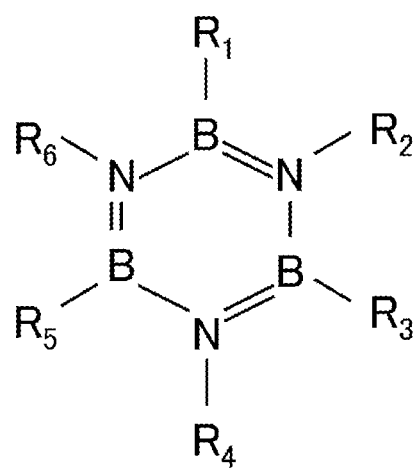
FIG. 16B illustrates a chemical formula of a borazine compound.

Here, borazine is a complex cyclic compound including boron (B), nitrogen (N), and hydrogen (H) and may be expressed by a compositional formula: $B_3H_6N_3$ and a chemical structural formula illustrated in FIG. 16A. A borazine compound is a compound including a borazine ring structure (which is also referred to as a borazine structure) constituting a borazine ring including three boron atoms and three nitrogen atoms. An organic borazine compound is a carbon (C)-containing borazine compound may also be a borazine compound including carbon-containing ligands. An alkylborazine compound is a borazine compound containing an alkyl group and may be a borazine compound containing an alkyl group as a ligand. The alkylborazine compound is obtained by substituting at least one of six hydrogen (H) atoms contained in borazine with hydrocarbon containing at least one carbon (C) atom and may be expressed by a chemical formula illustrated in FIG. 16B. In the chemical formula illustrated in FIG. 16B, each of R1 through R6 is a hydrogen (H) atom or an alkyl group containing 1 to 4 carbon (C) atoms. R1 through R6 may be the same alkyl groups or different alkyl groups. However, a case in which all of R1 through R6 are hydrogen is excluded. The alkylborazine compound may also be a substance including a borazine ring structure constituting a borazine ring and containing boron (B), nitrogen (N), hydrogen (H), and carbon (C). Also, the alkylborazine compound may also be a substance including a borazine ring structure and containing alkyl ligands. Furthermore, each of R1 through R6 may be a hydrogen (H) atom or an alkenyl group or alkynyl group containing 1 to 4 carbon (C) atoms. R1 through R6 may be the same alkenyl groups or alkynyl groups or different alkenyl groups or alkynyl groups. However, a case in which all of R1 through R6 are hydrogen is excluded. A reactive gas containing an organic borazine compound is a boron-containing gas (boron source), a nitrogen-containing gas (nitrogen source), and a carbon-containing gas (carbon source).

Figure 16C:
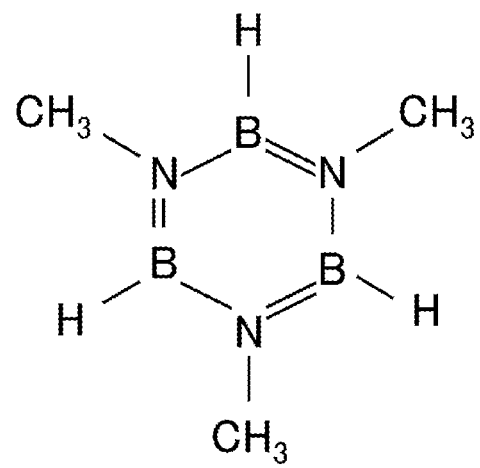
FIG. 16C illustrates a chemical formula of n,n',n''-trimethylborazine.

For example, n,n',n"-trimethylborazine (abbreviated as TMB) gas may be used as the reactive gas containing the borazine compound. TMB has a chemical structural formula illustrated in FIG. 16B, in which each of R1, R3, and R5 is hydrogen (H), and each of R2, R4, and R6 is a methyl group ($-CH_3$), and may be expressed by a chemical structural formula illustrated in FIG. 16C. TMB may be understood as a borazine compound including a borazine ring structure and containing a methyl group as a ligand. Also, when a borazine compound, such as TMB, which is in a liquid state at normal temperature and pressure, is used, the borazine compound in the liquid state is vaporized using a vaporization system, such as a vaporizer or a bubbler, and supplied as a reactive gas (TMB gas) containing the borazine compound. Furthermore, the reactive gas containing the borazine compound may be referred to simply as a borazine compound gas.

A nitriding gas (nitrogen-containing gas) is supplied from the gas supply pipe 232c into the process chamber 201 via the MFC 241c, the valve 243c, and the nozzle 249c, and the buffer chamber 237. For example, ammonia ($NH_3$) gas may be used as the nitriding gas.

For example, a hydrocarbon-based gas which is a gas containing carbon (C) (carbon-containing gas) is supplied from the gas supply pipe 232d into the process chamber 201 via the MFC 241d, the valve 243d, and the nozzle 249d. For example, propylene ($C_3H_6$) gas may be used as the carbon-containing gas.

For example, an amine-based gas which is a gas containing nitrogen (N) and carbon (C) is supplied from the gas supply pipe 232e into the process chamber 201 via the MFC 241e, the valve 243e, the gas supply pipe 232d, and the nozzle 249d.

Here, the amine-based gas means an amine in a gas state, for example, a gas containing an amine group, e.g., a gas obtained by vaporizing an amine in a liquid state at normal temperature and pressure or an amine in a gas state at normal temperature and pressure. The amine-based gas includes an amine, such as ethylamine, methylamine, propylamine, isopropylamine, butylamine, and isobutylamine. Here, the term "amine" refers collectively to compounds in which a hydrogen (H) atom of ammonia ($NH_3$) is substituted with a hydrocarbon group such as an alkyl group. That is, an amine includes a hydrocarbon group, such as an alkyl group, as a ligand containing a carbon (C) atom. An amine-based gas may be referred to as a boron (B)-free gas because the amine-based source gas does not contain boron but contains three elements, i.e., the element C, the element N, and the element H, and may be referred to as a boron/metal-free gas because the amine-based gas does not contain boron or a metal. The amine-based gas is a nitrogen-containing gas (nitrogen source), a carbon-containing gas (carbon source), and a hydrogen-containing gas. The amine-based gas may be referred to as a gas including only three elements of the amine group, i.e., the element C, the element N, and the element H. Also, when the term 'amine' is used in the present disclosure, it may be understood as an amine in a liquid state, an amine-based gas, or both of them. For example, triethylamine $[(C_2H_5)_3N]$, abbreviated as TEA] gas may be used as the amine-based gas. When an amine, such as TEA, which is in a liquid state at normal temperature and pressure, is used, the amine in the liquid state is vaporized using a vaporization system such as a vaporizer or a bubbler and supplied as a source gas (TEA gas) containing nitrogen and carbon.

An inert gas, e.g., nitrogen ($N_2$) gas, is supplied from the gas supply pipes 232f to 232i into the process chamber 201 via the MFCs 241f to 241i, the valves 243f to 243i, the gas supply pipes 232a to 232d, the nozzles 249a to 249d, and the buffer chamber 237.

When the gases described above are respectively supplied from the respective gas supply pipes 232a to 232d, a source gas supply system that supplies a source gas containing boron and a halogen element, i.e., a chloroborane-based source gas supply system, is mainly configured by the gas supply pipe 232a, the MFC 241a, and the valve 243a. Also, the nozzle 249a may be included in the chloroborane-based source gas supply system. Furthermore, the source gas supply system may also be referred to as a source supply system, and the chloroborane-based source gas supply system may also be referred to as a chloroborane-based source supply system.

Also, a reactive gas supply system that supplies a reactive gas containing a borazine compound, i.e., an organic borazine-based gas (borazine-based gas) supply system, is mainly configured by the gas supply pipe 232b, the MFC 241b, and the valve 243b. The nozzle 249b may be included in the organic borazine-based gas supply system. Furthermore, the reactive gas supply system may also be referred to as a borazine compound gas supply system.

Also, a nitriding gas (nitrogen-containing gas) supply system is mainly configured by the gas supply pipe 232c, the MFC 241c, and the valve 243c. The nozzle 249c and the buffer chamber 237 may be included in the nitriding gas supply system.

A hydrocarbon-based gas supply system which is a carbon-containing gas supply system is mainly configured by the gas supply pipe 232d, the MFC 241d, and the valve 243d. The nozzle 249d may be included in the hydrocarbon-based gas supply system.

Also, an amine-based gas supply system which is a gas supply system containing nitrogen and carbon is mainly configured by the gas supply pipe 232e, the MFC 241e, and the valve 243e. The amine-based gas supply system may include the nozzle 249d at a downstream side of a portion of the gas supply pipe 232d connected to the gas supply pipe 232e.

An inert gas supply system is mainly configured by the gas supply pipes 232f to 232i, the MFCs 241f to 241i, and the valves 243f to 243i. Also, the inert gas supply system may include the buffer chamber 237 and the nozzles 249a to 249d at downstream sides of portions of the gas supply pipes 232a to 232d respectively connected to the gas supply pipes 232f to 232i. The inert gas supply system also functions as a purge gas supply system.

Figure 2:
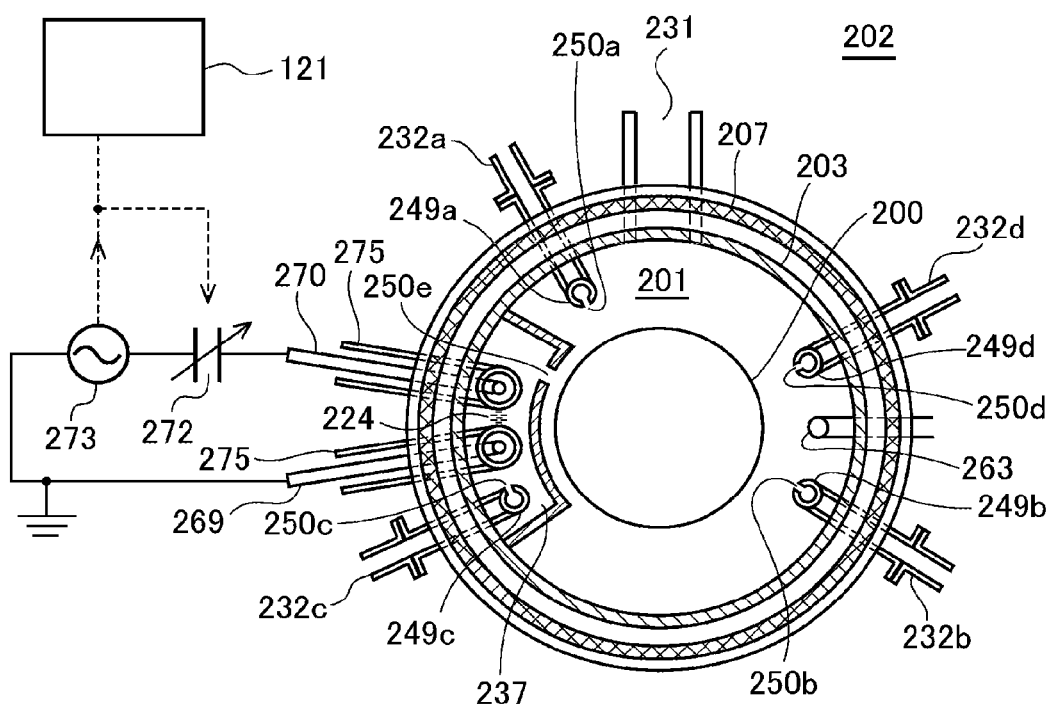
FIG. 2 is a schematic configuration diagram of the longitudinal process furnace of the substrate processing apparatus preferably used in an exemplary embodiment of the present invention, in which a cross-sectional view of the process furnace taken along line A-A of FIG. 1 is illustrated.

Two rod electrodes 269 and 270, each of which is formed of a conductive material and has a thin, long structure as illustrated in FIG. 2, are installed in the buffer chamber 237 from the lower portion of the reaction tube 203 to the upper portion thereof in the direction in which the wafers 200 are stacked. Each of the rod electrodes 269 and 270 is installed parallel to the nozzle 249c. Each of the rod electrodes 269 and 270 is coated with and protected by an electrode protection pipe 275 from an upper portion of the corresponding electrode to a lower portion thereof. One of the rod electrodes 269 and 270 is connected to a radio-frequency (RF) power source 273 via a matcher 272, and the other thereof is connected to an earth which is a ground potential. By applying RF power from the RF power source 273 via the matcher 272 between the rod electrodes 269 and 279, plasma is generated in a plasma generation region 224 between the rod electrodes 269 and 270. A plasma source serving as a plasma generator (plasma generation unit) mainly includes the rod electrodes 269 and 270 and the electrode protection pipes 275. Also, the plasma source may further include the matcher 272 and the RF power source 273. The plasma source functions as an activation mechanism (excitation unit) configured to activate (excite) a gas to generate plasma as described below.

The electrode protection pipe 275 is configured to isolate each of the rod electrodes 269 and 270 from an atmosphere of the buffer chamber 237 and insert each of the rod electrodes 269 and 270 into the buffer chamber 237. Here, when an oxygen ($O_2$) concentration in the electrode protection pipe 275 is about equal to an oxygen concentration in the outside air [atmosphere], the rod electrodes 269 and 270 respectively inserted in the electrode protection pipes 275 are oxidized by heat generated by the heater 207. For this reason, the insides of the electrode protection pipes 275 are previously filled with an inert gas, such as nitrogen gas, or purged with an inert gas, such as nitrogen gas, using an inert gas purge mechanism so that the oxygen concentration in the electrode protection pipes 275 can be reduced to prevent oxidation of the rod electrodes 269 and 270.

The exhaust pipe 231 is installed at the reaction tube 203 to exhaust an atmosphere in the process chamber 201. A vacuum pump 246 serving as a vacuum exhaust device is connected to the exhaust pipe 231 via a pressure sensor 245 serving as a pressure detector (pressure detection unit) configured to detect an inside pressure of the process chamber 201 and an auto pressure controller (APC) valve 244 serving as a pressure regulator (pressure regulating unit). Also, the APC valve 244 may be configured to vacuum-exhaust the inside of the process chamber 201 or suspend the vacuum-exhausting by opening/closing the APC valve 244 while the vacuum pump 246 is operated, and to regulate an inside pressure of the process chamber 201 by adjusting a degree of opening of the APC valve 244 based on pressure information detected by the pressure sensor 245 while the vacuum pump 246 is operated. An exhaust system mainly includes the exhaust pipe 231, the APC valve 244, and the pressure sensor 245. Also, the exhaust system may further include the vacuum pump 246.

Below the reaction tube 203, a seal cap 219 is installed as a furnace port lid that may air-tightly close a lower end aperture of the reaction tube 203. The seal cap 219 is configured to come in contact with a lower end of the reaction tube 203 from a lower portion thereof in a vertical direction. The seal cap 219 is formed of, for example, a metal, such as stainless steel, and has a disk shape. An O-ring 220 serving as a seal member that comes in contact with the lower end of the reaction tube 203 is installed on a top surface of the seal cap 219. A rotating mechanism 267 that rotates the boat 217 (which will be described below) is installed at a side of the seal cap 219 opposite to the process chamber 201. A rotation shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved by a boat elevator 115 that is a lifting mechanism vertically installed outside the reaction tube 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, into or out of the process chamber 201.

The boat 217 serving as a substrate supporter is formed of a heat-resistant material, e.g., quartz or silicon carbide, and is configured to support the wafers 200 in a state in which the wafers 200 are arranged in a concentrically multilayered structure in a horizontal posture. Below the boat 217, an insulating member 218 formed of a heat-resistant material, e.g., quartz or silicon carbide, is installed and configured to prevent heat generated from the heater 207 from being transmitted to the seal cap 219. Also, the insulating member 218 may include a plurality of insulating plates formed of a heat-resistant material, e.g., quartz or silicon carbide, and an insulating plate holder that supports the plurality of insulating plates in a multilayered structure in a horizontal posture.

In the reaction tube 203, a temperature sensor 263 is installed as a temperature detector, and is configured to control an amount of current to be supplied to the heater 207 based on temperature information detected by the temperature sensor 263, so that the temperature in the process chamber 201 may have a desired temperature distribution. The temperature sensor 263 has an L shape similar to the nozzles 249a to 249d, and is installed along an inner wall of the reaction tube 203.

Figure 3:
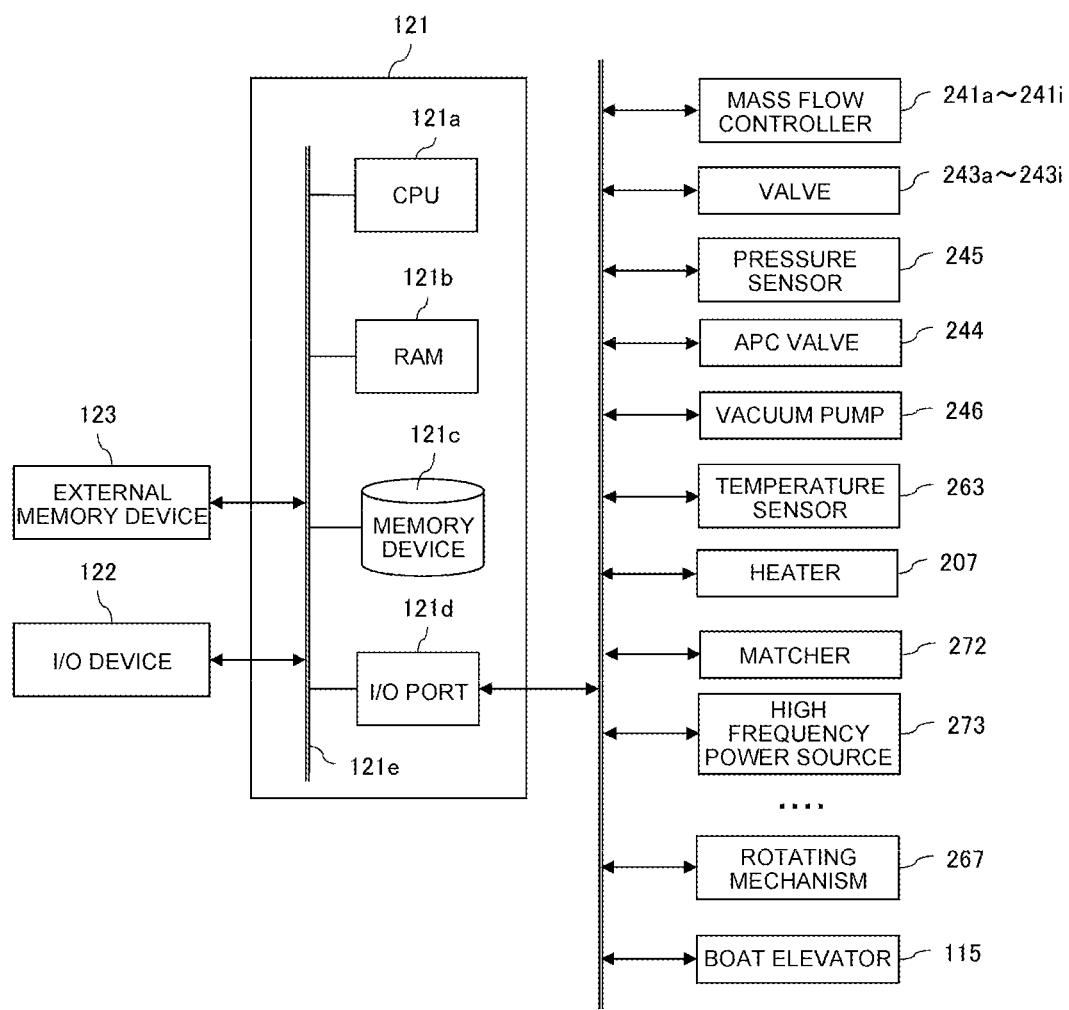
FIG. 3 is a schematic configuration diagram of a controller of a substrate processing apparatus preferably used in an exemplary embodiment of the present invention, in which a block diagram of a control system of a controller is illustrated.

As illustrated in FIG. 3, a controller 121 which is a control unit (control device) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 121e. An I/O device 122 configured, for example, as a touch panel or the like is connected to the controller 121.

The memory device 121c includes, for example, a flash memory, a hard disk drive (HDD), or the like. In the memory device 121c, a control program for controlling an operation of a substrate processing apparatus or a process recipe including a sequence or conditions of substrate processing which will be described below is stored to be readable. The process recipe is a combination of sequences of a substrate processing process which will be described below to obtain a desired result when the sequences are performed by the controller 121, and acts as a program. Hereinafter, the process recipe, the control program, etc. will be referred to together simply as a 'program.' Also, when the term 'program' is used in the present disclosure, it should be understood as including only a process recipe, only a control program, or both of the process recipe and the control program. The RAM 121b is configured as a memory area (work area) in which a program or data read by the CPU 121a is temporarily retained.

The I/O port 121d is connected to the MFCs 241a to 241i, the valves 243a to 243i, the pressure sensor 245, the APC valve 244, the vacuum pump 246, the heater 207, the temperature sensor 263, the RF power source 273, the matcher 272, the rotating mechanism 267, and the boat elevator 115.

The CPU 121a is configured to read and execute the control program from the memory device 121c and to read the process recipe from the memory device 121c according to a manipulation command received via the I/O device 122. Also, according to the read process recipe, the CPU 121a is configured to control flow rates of various gases via the MFCs 241a to 241i; control opening/closing of the valves 243a to 243i; control the degree of pressure by opening/closing the APC valve 244 based on the pressure sensor 245 using the APC valve 244; control driving/suspending of the vacuum pump 246; control temperature using the heater 207 based on the temperature sensor 263; control supply of power using the RF power source 273; control impedance using the matcher 272; control the rotation and rotation speed of the boat 217 using the rotating mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing a program as described above [e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.)], and then installing the program in a general-purpose computer using the external memory device 123. Also, device for supplying a program to a computer are not limited to using the external memory device 123. For example, a program may be supplied to a computer using communication device, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be referred to together simply as a 'recording medium.' Also, when the term 'recording medium' is used in the present disclosure, it may be understood as only the memory device 121c, only the external memory device 123, or both the memory device 121c and the external memory device 123.

(2) Substrate Processing Process

Next, an example of a sequence of a process of forming a thin film on a substrate using the process furnace of the substrate processing apparatus described above will be described as a process included in a process of manufacturing a semiconductor device (device). In the following description, operations of constitutional elements of the substrate processing apparatus are controlled by the controller 121.

In the film forming sequence of the present embodiment, a thin film containing boron (B) and a borazine ring structure is formed on a substrate by performing, a predetermined number of times, a cycle including a process of supplying a source gas containing boron and a halogen element to the substrate; and a process of supplying a reactive gas containing a borazine compound to the substrate under a condition where the borazine ring structure in the borazine compound is retained.

In the process of supplying the source gas, a first layer containing boron and a halogen element is formed. In the process of supplying the reactive gas, the first layer containing the boron and the halogen element is reacted with the borazine compound to modify the first layer, so that a second layer containing boron and a borazine ring structure can be formed.

In addition, performing the cycle including the process of supplying the source gas and the process of supplying the reactive gas a predetermined number of times includes performing a cycle during which the process of supplying the source gas and the process of supplying the reactive gas are performed alternately or simultaneously, once or performing the cycle a plurality of times. That is, it means performing the cycle at least once. In other words, it may mean that the cycle including performing the process of supplying the source gas and the process of supplying the reactive gas alternately or simultaneously is performed once or repeated a plurality of times. Here, the cycle is preferably repeated a plurality of times.

Hereinafter, the film forming sequence of the present embodiment will be described with reference to FIGS. 4 and 5A.

In the film forming sequence illustrated in FIGS. 4 and 5A, a thin film containing boron (B), carbon (C), and nitrogen (N) and a borazine ring structure (hereinafter referred to as a BCN film containing the borazine ring structure) is formed on a wafer 200 by performing, a predetermined number of times, a cycle including a process of supplying a chloroborane-based source gas ($BCl_3$ gas) as a source gas containing boron and a halogen element (Cl) to the wafer 200; and a process of supplying an organic borazine-based gas (TMB gas) as a reactive gas containing a borazine compound to the wafer 200 under a condition where the borazine ring structure in the borazine compound (TMB) is retained. In the following description, the BCN film containing the borazine ring structure may also be referred to simply as a BCN film for brevity.

FIGS. 4 and 5A illustrate a case in which the process of supplying the chloroborane-based source gas and the process of supplying the organic borazine-based gas are alternately performed a predetermined number of times.

When the term 'wafer' is used in the present disclosure, it should be understood as either the wafer itself, or both the wafer and a stacked structure (assembly) including a specific layer/film formed on a surface of the wafer (i.e., the wafer and the specific layer/film formed thereon may also be referred to collectively as the 'wafer'). Also, when the expression 'surface of the wafer' is used in the present disclosure, it should be understood as either a surface (exposed surface) of the wafer itself or a surface of a specific layer/film formed on the wafer, i.e., an uppermost surface of the wafer as a stacked structure.

Thus, in the present disclosure, the expression 'a specific gas is supplied to a wafer' should be understood to mean that the specific gas is directly supplied to a surface (exposed surface) of the wafer or that the specific gas is supplied to a surface of a layer/film on the wafer, i.e., on the uppermost surface of the wafer as a stacked structure. Also, in the present disclosure, the expression 'a specific layer (or film) is formed on the wafer' should be understood to mean that the specific layer (or film) is directly formed on a surface (exposed surface) of the wafer itself or that the specific layer (or film) is formed on the layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

(Wafer Charging and Boat Loading)

When a plurality of wafers 200 are placed in the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 in which the wafers 200 are present is vacuum-exhausted to have a desired pressure (degree of vacuum) by the vacuum pump 246. In this case, the inside pressure of the process chamber 201 is measured by the pressure sensor 245, and the APC valve 244 is feedback-controlled based on information regarding the measured pressure (pressure control). The vacuum pump 246 is kept operated at least until processing of the wafers 200 is completed. Also, the wafers 200 in the process chamber 201 are heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the wafers 200 begins by rotating the boat 217 using the rotating mechanism 267. Also, the rotation of the boat 217 and the wafers 200 by the rotating mechanism 267 is continuously performed at least until the processing of the wafers 200 is completed.

(Process of Forming a BCN Film)

Then, the following two steps, i.e., steps 1a and 2a, are sequentially performed.

[Step 1a] (Supply of $BCl_3$ Gas)

The valve 243a is opened to supply $BCl_3$ gas into the gas supply pipe 232a. The $BCl_3$ gas, the flow rate of which is controlled by the MFC 241a, is supplied into the process chamber 201 from the gas supply holes 250a, and exhausted from the exhaust pipe 231. In this case, the $BCl_3$ gas is supplied to the wafer 200. At the same time, the valve 243f is opened to supply an inert gas such as $N_2$ gas into the gas supply pipe 232f. The $N_2$ gas, the flow rate of which is controlled by the MFC 241f, is supplied into the process chamber 201 together with the $BCl_3$ gas, and exhausted from the exhaust pipe 231.

In this case, in order to prevent the $BCl_3$ gas from flowing into the nozzles 249b to 249d and the buffer chamber 237, the valves 243g to 243i are opened to supply $N_2$ gas into the gas supply pipes 232g to 232i. The $N_2$ gas is supplied into the process chamber 201 via the gas supply pipes 232b to 232d, the nozzles 249b to 249d, and the buffer chamber 237, and exhausted from the exhaust pipe 231.

In this case, the inside pressure of the process chamber 201 is set to be within, for example, a range of 1 to 13,300 Pa, and preferably a range of 20 to 1,330 Pa, by appropriately controlling the APC valve 244. The supply flow rate of the $BCl_3$ gas controlled by the MFC 241a is set, for example, to be within a range of 1 to 1,000 sccm. The supply flow rate of the $N_2$ gas controlled by each of the MFCs 241f to 241i is set, for example, to be within a range of 100 to 10,000 sccm. A duration for which the $BCl_3$ gas is supplied to the wafer 200, i.e., a gas supply time (gas irradiation time), is set to range, for example, from 1 to 120 seconds, and preferably 1 to 60 seconds. In this case, the temperature of the heater 207 may be set such that the temperature of the wafer 200 is within a range of 250 to 700° C., preferably a range of 300 to 650° C., and more preferably a range of 350 to 600° C. If the temperature of the wafer 200 is less than 250° C., it is difficult for $BCl_3$ to be chemically adsorbed onto the wafer 200 and thus a practical film-forming rate may not be achieved. This problem may be overcome when the temperature of the wafer 200 is controlled to be 250° C. or more. Also, when the temperature of the wafer 200 is controlled to be 300° C. or more or 350° C. or more, $BCl_3$ may be more sufficiently adsorbed onto the wafer 200 and a more sufficient film-forming rate can be achieved. Also, when the temperature of the wafer 200 is greater than 700° C., a chemical vapor deposition (CVD) reaction becomes stronger (gas-phase reaction is dominant), and thickness uniformity is likely to be degraded and may thus be difficult to control. When the temperature of the wafer 200 is controlled to be 700° C. or less, the thickness uniformity may be prevented from being degraded and thus be controlled. In particular, when the temperature of wafer 200 is controlled to be 650° C. or less or 600° C. or less, a surface reaction becomes dominant, and the thickness uniformity may be easily achieved and thus be easily controlled. Thus, the temperature of the wafer 200 may be within a range of 250 to 700° C., preferably a range of 300 to 650° C., and more preferably a range of 350 to 600° C.

Under the conditions described above, the $BCl_3$ gas is supplied into the process chamber 201 to form a boron-containing layer including chlorine (Cl) as a first layer on the wafer 200 (an underlying film formed on the surface of the wafer 200) to a thickness of less than one atomic layer to several atomic layers. The first layer may include an adsorption layer of the $BCl_3$ gas, a chlorine-containing boron layer, or both of these layers.

Here, the chlorine-containing boron layer generally refers to all layers including a continuous layer formed of boron (B) and containing chlorine (Cl), a discontinuous layer formed of boron and containing chlorine, and a chlorine-containing boron thin film formed by overlapping the continuous layer and the discontinuous layer. The continuous layer formed of boron and containing chlorine may also be referred to as a chlorine-containing boron thin film. Also, boron (B) used to form the chlorine-containing boron layer should be understood not only as including boron from which a bond with chlorine is not completely broken but also as including boron from which a bond with chlorine is completely broken.

Examples of the adsorption layer of $BCl_3$ gas include not only a chemical adsorption layer including continuous gas molecules of the $BCl_3$ gas but also a chemical adsorption layer including discontinuous gas molecules of the $BCl_3$ gas. That is, the adsorption layer of the $BCl_3$ gas includes a chemical adsorption layer formed of $BCl_3$ molecules to a thickness of one molecular layer or less than one molecular layer. Also, $BCl_3$ molecules of the adsorption layer of the $BCl_3$ gas may have a chemical formula in which a bond between boron (B) and chlorine (Cl) is partially broken.

A layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer.

Boron (B) is deposited on the wafer 200 to form a chlorine-containing boron layer on the wafer 200 under a condition where $BCl_3$ gas is self-decomposed (pyrolyzed), i.e., conditions causing a pyrolysis reaction of $BCl_3$. The $BCl_3$ gas is adsorbed onto the wafer 200 to form an adsorption layer of the $BCl_3$ gas on the wafer 200 under a condition where $BCl_3$ gas is not self-decomposed (pyrolyzed), i.e., conditions that do not cause a pyrolysis reaction of $BCl_3$. A film-forming rate may be higher when the chlorine-containing boron layer is formed on the wafer 200 than when the adsorption layer of the $BCl_3$ gas is formed on the wafer 200.

If the thickness of the first layer formed on the wafer 200 exceeds a thickness of several atomic layers, the modification action performed in step 2a which will be described below does not have an effect on the entire first layer. The first layer that may be formed on the wafer 200 may have a minimum thickness of less than one atomic layer. Thus, the first layer may be set to have a thickness of less than one atomic layer to several atomic layers. Also, the modification action performed in step 2a (which will be described below) may be relatively increased by controlling the first layer to have a thickness not more than one atomic layer, i.e., a thickness of less than one atomic layer or of one atomic layer, thereby reducing a time required to perform the modification action in step 2a. Also, a time required to form a first layer in step 1a may be reduced. Accordingly, a process time per cycle may be reduced and a process time to perform a total of cycles may thus be reduced. That is, a film-forming rate may be increased. Also, thickness uniformity may be controlled to be increased by controlling the first layer to have a thickness of one atomic layer or less.

(Removing of Remnant Gas)

After the first layer is formed, the valve 243a is closed and the supply of the $BCl_3$ gas is stopped. In this case, the inside of the process chamber 201 is vacuum-exhausted by the vacuum pump 246 while the APC valve 244 is open, thereby eliminating the $BCl_3$ gas (that does not react or that has contributed to the formation of the first layer) remaining in the process chamber 201 from the process chamber 201. In this case, $N_2$ gas is continuously supplied as an inert gas into the process chamber 201 while the valves 243f to 243i are open. The $N_2$ gas acts as a purge gas to increase the effect of eliminating the $BCl_3$ gas (that does not react or that has contributed to the formation of the first layer) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 2a to be performed thereafter will not be badly influenced by the gas. In this case, the flow rate of the $N_2$ gas to be supplied into the process chamber 201 need not be high. For example, the inside of the process chamber 201 may be purged without causing step 2a to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the chloroborane-based source gas, not only $BCl_3$ gas but also an inorganic source gas, such as monochloroborane ($BClH_2$) gas or dichloroborane ($BCl_2H$) gas, or an organic source gas, such as chloro(dimethyl)borane ($C_2H_6BCl$) gas, methylethylchloroborane ($CH_3C_2H_5BCl$) gas, methyldichloroborane ($CH_3BCl_2$) gas, ethyldichloroborane ($C_2H_5BCl_2$) gas, phenyldichloroborane ($C_6H_5BCl_2$) gas, or cyclohexyldichloroborane ($C_6H_{11}BCl_2$) gas, may be used. As the inert gas, not only $N_2$ gas but also a rare gas, such as argon (Ar) gas, helium (He) gas, neon (Ne) gas, xenon (Xe) gas, etc., may be used.

[Step 2a] (Supply of TMB Gas)

After step 1a ends and the gas remaining in the process chamber 201 is eliminated, the valve 243b is opened to supply TMB gas into the gas supply pipe 232b. The TMB gas, the flow rate of which is adjusted by the MFC 241b, is supplied from the gas supply holes 250b into the process chamber 201, and exhausted from the exhaust pipe 231. In this case, the TMB gas is supplied to the wafer 200. At the same time, the valve 243g is opened to supply $N_2$ gas as an inert gas into the gas supply pipe 232g. The $N_2$ gas, the flow rate of which is adjusted by the MFC 241g, is supplied into the process chamber 201 together with the TMB gas and exhausted from the exhaust pipe 231.

In this case, in order to prevent the TMB gas from flowing into the nozzles 249a, 249c, and 249d and the buffer chamber 237, the valves 243f, 243h, and 243i are opened to supply $N_2$ gas into the gas supply pipes 232f, 232h, and 232i. The $N_2$ gas is supplied into the process chamber 201 via the gas supply pipes 232a, 232c, and 232d the nozzles 249a, 249c, and 249d, and the buffer chamber 237 and is then exhausted from the exhaust pipe 231.

In this case, the APC valve 244 is appropriately adjusted to set the inside pressure of the process chamber 201 to be within a range of, for example, 1 to 13,300 Pa, and preferably a range of 500 to 5,000 Pa. The supply flow rate of the TMB gas controlled by the MFC 241b is set to be within, for example, a range of 1 to 1,000 sccm. The supply flow rate of the $N_2$ gas controlled by each of the MFCs 241f to 241i is set to be within, for example, a range of 100 to 10,000 sccm. A duration for which the TMB gas is supplied to the wafer 200, i.e., a gas supply time (gas irradiation time), is set to be within, for example, a range of 1 to 120 seconds, and preferably a range of 1 to 60 seconds. In this case, similar to step 1a, the temperature of the heater 207 is set such that the temperature of the wafer 200 falls within, for example, a range of 250 to 700° C., preferably 300 to 650° C., and more preferably a range of 350 to 600° C., similar to step 1.

By supplying TMB gas to the wafer 200 under the above-described conditions, a reaction of the first layer formed on the wafer 200 in step 1a with the TMB gas is caused. That is, chlorine (a chloro group) contained in the first layer may be reacted with a ligand (a methyl group) contained in TMB. Thus, chlorine contained in the first layer, which has reacted with the ligand, may be separated (drawn) from the first layer and also, the ligand contained in TMB, with which chlorine contained in the first layer has reacted, may be separated from TMB. Also, nitrogen (N) constituting a borazine ring of TMB from which the ligand has been separated may bind with boron (B) contained in the first layer. That is, from among boron and nitrogen constituting a borazine ring of TMB, nitrogen having a dangling bond by separating a methyl ligand may bind with boron included in the first layer and having a dangling bond or boron which had a dangling bond, so that a B—N bond can be formed. In this case, a borazine ring structure constituting the borazine ring of TMB is not broken but retained.

By supplying TMB gas under the above-described condition, the borazine ring structure in TMB may not be broken but retained while appropriately reacting the first layer with TMB, and a series of reactions described above may be caused. Also, the most important factors (conditions) for causing the series of reactions while retaining the borazine ring structure in TMB are regarded as a temperature of the wafer 200 and an inside pressure of the process chamber 201, especially the temperature of the wafer 200. By appropriately controlling the factors, appropriate reactions may be caused.

Due to the series of reactions, a borazine ring is newly introduced into the first layer, and the first layer is changed (modified) into a second layer including a borazine ring structure and containing boron, carbon, and nitrogen, that is, a BCN layer including a borazine ring structure (hereinafter referred to simply as a BCN layer). The second layer becomes a layer having a thickness of less than one atomic layer to several atomic layers. The BCN layer including the borazine ring structure may also be understood as a layer containing boron, carbon, and a borazine ring structure.

By newly introducing the borazine ring into the first layer, the element N constituting the borazine ring and the element C contained in the ligand of TMB are newly introduced into the first layer. In this case, the element B constituting the borazine ring is newly introduced into the first layer. Thus, the second layer becomes a layer containing the element B at a higher content than the first layer, that is, a boron-rich layer.

When the second layer is formed, chlorine contained in the first layer or hydrogen contained in the TMB gas forms a gaseous substance, for example, chlorine ($Cl_2$) gas, hydrogen ($H_2$) gas, or hydrogen chloride (HCl) gas, during modification of the first layer due to TMB gas, and is exhausted from the inside of the process chamber 201 via the exhaust pipe 231. That is, impurities, such as chlorine, contained in the first layer are drawn or deintercalated from the first layer and separated from the first layer. Thus, the second layer becomes a layer containing impurities, such as chlorine, at a lower content than the first layer.

When the second layer, since the borazine ring structure constituting the borazine ring contained in TMB is not broken but retained, a central space of the borazine ring may be preserved, and a porous BCN layer may be formed.

(Removing of Remnant Gas)

After the second layer is formed, the valve 243b is closed and the supply of the TMB gas is stopped. In this case, the inside of the process chamber 201 is vacuum-exhausted by the vacuum pump 246 while the APC valve 244 is open, thereby eliminating the TMB gas (that does not react or that contributes to the formation of the second layer) or byproducts remaining in the process chamber 201 from the process chamber 201. In this case, $N_2$ gas is continuously supplied as an inert gas into the process chamber 201 while the valves 243f to 243i are open. The $N_2$ gas acts as a purge gas to increase the effect of eliminating the TMB gas (that does not react or that has contributed to formation of the first layer) or by-products remaining in the process chamber 201 from the process chamber 201.

In this case, the gas remaining in the process chamber 201 may not be completely eliminated and the inside of the process chamber 201 may not be completely purged. When a small amount of a gas remains in the process chamber 201, step 1a to be performed thereafter will not be badly influenced by the gas. In this case, the flow rate of the $N_2$ gas to be supplied into the process chamber 201 need not be high. For example, the inside of the process chamber 201 may be purged without causing step 1a to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

Figure 16D:
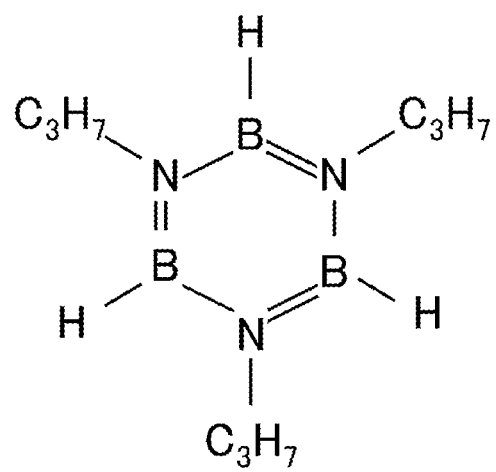
FIG. 16D illustrates a chemical formula of n,n',n''-tri-n-propylborazine.

As the organic borazine-based gas, not only TMB gas but also, for example, n,n',n"-triethylborazine (abbreviated as TEB) gas, n,n',n"-tri-n-propylborazine (abbreviated as TPB) gas, n,n',n"-triisopropylborazine (abbreviated as TIPB) gas, n,n',n"-tri-n-butylborazine (abbreviated as TBB) gas, or n,n', n"-triisobutylborazine (abbreviated as TIBB) gas may be used. For example, TPB has a chemical structural formula illustrated in FIG. 16B in which each of R1, R3, and R5 is hydrogen (H), and each of R2, R4, and R6 is a propyl group ($—C_3H_7$) and may be expressed by a chemical structural formula illustrated in FIG. 16D. Also, TMB is a borazine compound including a borazine ring structure and containing a methyl group as a ligand. TEB is a borazine compound including a borazine ring structure and containing an ethyl group as a ligand. TPB is a borazine compound including a borazine ring structure and containing a propyl group as a ligand. TIPB is a borazine compound including a borazine ring structure and containing an isopropyl group as a ligand. TBB is a borazine compound including a borazine ring structure and containing a butyl group as a ligand. TIBB is a borazine compound including a borazine ring structure and containing an isobutyl group as a ligand.

(Performing a Cycle a Predetermined Number of Times)

A BCN film including a borazine ring structure may be formed on the wafer 200 to have a predetermined composition and a predetermined thickness by performing a cycle including steps 1a and 2a described above at least once (a predetermined number of times), i.e., by alternately performing steps 1a and 2a at least once (a predetermined number of times). The cycle described above is preferably performed a plurality of times. That is, a thickness of a BCN layer to be formed per cycle may be set to be less than a desired thickness and the cycle may be performed a plurality of times until the SiCN film has the desired thickness.

By controlling process conditions, such as an inside pressure of the process chamber 201 or a gas supply time, in each step, contents of respective elements (i.e., the element B, the element C, and the element N) in the BCN layer, that is, a boron concentration, carbon concentration, and nitrogen concentration of the BCN layer, may be finely adjusted, and a content ratio of the BCN film may be controlled more strictly.

When the cycle is performed a plurality of times, the expression 'specific gas is supplied to a wafer' in each step to be performed after at least a second cycle should be understood to mean that the specific gas is supplied to a layer on the wafer 200, i.e., on the uppermost surface of the wafer 200 as a stacked structure. Also, in the present disclosure, the expression 'a specific layer is formed on the wafer 200' should be understood to mean that the specific layer is formed on the layer formed on the wafer 200, i.e., on the uppermost surface of the wafer 200 as a stacked structure. This has been described above, and also applies to modified examples and other embodiments which will be described below.

(Purging and Atmospheric Pressure Recovery)

After the BCN film including the borazine ring structure is formed to have the predetermined composition and the predetermined thickness, $N_2$ gas is supplied as an inert gas from each of the gas supply pipes 232f to 232i into the process chamber 201 by opening the valves 243f to 243i, and then is exhausted from the exhaust pipe 231. The $N_2$ gas acts as a purge gas, so that the inside of the process chamber 201 is purged with the inert gas, thereby eliminating a gas or by-products remaining in the process chamber 201 from the process chamber 201 (gas purging). Thereafter, an atmosphere in the process chamber 201 is replaced with the inert gas (inert gas replacement), and the inside pressure of the process chamber 201 is recovered to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to the outside of the reaction tube 203 from the lower end of the reaction tube 203 while being supported by the boat 217 (boat unloading). Thereafter, the processed wafers 200 are unloaded from the boat 217 (wafer discharging).

(3) Effects of the Present Embodiment

According to the present embodiment, one or more effects which will be described below may be obtained.

(a) According to the film forming sequence of the present invention, by performing the cycle including steps 1a and 2a a predetermined number of times, a BCN film having a higher tolerance to hydrogen fluoride (HF) and a lower dielectric constant than a conventional SiCN film or SiOCN film may be formed in a low-temperature region on the wafer 200. That is, a thin film capable of satisfying both an improvement in tolerance to hydrogen fluoride and a reduction in dielectric constant which have a tradeoff relationship to each other may be formed in the low-temperature region.

(b) According to the film forming sequence of the present embodiment, after $BCl_3$ gas is supplied to form the first layer on the wafer 200 in step 1a, the first layer is modified by supplying TMB gas to further form the second layer. Thus, a composition of the BCN film may be easily controlled and a BCN film having desired characteristics may be formed.

In particular, according to the film forming sequence of the present invention, by performing two processes, i.e., a process of supplying $BCl_3$ gas as a first boron gas and a process of supplying TMB gas as a second boron gas during one cycle, that is, by forming a film using two kinds of boron sources (a double boron source) during one cycle, not only the element B contained in the $BCl_3$ gas but also the element B contained in the TMB gas may be newly added to the BCN film. That is, a boron (B) concentration in the BCN film may be controlled to be higher than when a film is formed using one kind of boron source (a single boron source) during one cycle.

In addition, by adjusting a boron (B) concentration, a carbon (C) concentration, or a nitrogen (N) concentration in the BCN film, a tolerance of the BCN film to hydrogen fluoride or hot phosphoric acid may be controlled. For example, a tolerance of the BCN film to hydrogen fluoride may be controlled to be higher than a BN film by increasing the boron concentration and carbon concentration in the BCN film, and be controlled to be higher than or similar to the BN film by decreasing the boron concentration and carbon concentration in the BCN film. For example, a tolerance of the BCN film to hot phosphoric acid may be controlled to be lower than the BN film by increasing the nitrogen concentration in the BCN film, and be controlled to be higher than or similar to the BN film by decreasing the nitrogen concentration in the BCN film. Also, for example, the tolerance of the BCN film to hot phosphoric acid may be controlled to be higher than the BN film by increasing the carbon concentration in the BCN film.

(c) According to the film forming sequence of the present embodiment, a gas (TMB gas) containing a borazine compound which is highly reducible and highly reactive with a halogen element, such as chlorine (Cl), is used as a reactive gas. Accordingly, in step 2a, the first layer may be efficiently reacted with the reactive gas, and the second layer may be efficiently formed. Thus, throughput of formation of a BCN film may be improved.

(d) According to the film forming sequence of the present embodiment, a BCN film containing three elements, i.e., boron, carbon, and nitrogen, may be formed using two kinds of gases, i.e., $BCl_3$ gas and TMB gas. That is, it is unnecessary to separately supply a boron source, a nitrogen source, and a carbon source during a film forming process. Therefore, a required time per cycle may be reduced to further improve film forming throughput. Also, by reducing the number of kinds of gases required for forming films, a configuration of a gas supply system may be simplified to reduce the number of nozzles. Thus, system costs may be reduced to facilitate maintenance.

(e) According to the film forming sequence of the present embodiment, when the second layer is formed, the borazine ring structure constituting a borazine ring contained in the borazine compound (TMB) is not broken but retained so that the BCN film may be formed as a porous type and a dielectric constant of the BCN film may be further reduced. That is, a porous film (low-k film) having an extremely low dielectric constant may be formed.

According to the film forming sequence of the present embodiment, when the second layer is formed, at least a portion of the borazine ring structure constituting the borazine ring contained in the borazine compound (TMB) is not retained but broken to eliminate a central space of the borazine ring, for example, by controlling a wafer temperature or an inside pressure of the process chamber to be higher than in the process conditions as described above. Thus, a state (density) of the borazine ring structure of the BCN film, i.e., a porous state (density) of the BCN film, may be changed so that a dielectric constant of the BCN film may be finely adjusted.

According to the film forming sequence of the present embodiment as described above, a dielectric constant of the BCN film may be controlled by changing a state of the borazine ring structure of the BCN film, i.e., by retaining the borazine ring structure or breaking at least a portion thereof. Also, a film stress may be controlled by changing the state of the borazine ring structure in the BCN film.

(f) According to the film forming sequence of the present embodiment, impurities, such as chlorine (Cl), may be drawn or deintercalated from the first layer by reacting the first layer with TMB gas in step 2a. As a result, a dopant concentration in the BCN film may be reduced, and a tolerance of the BCN film to hydrogen fluoride may be further improved.

Modified Example 1

Figure 5C:
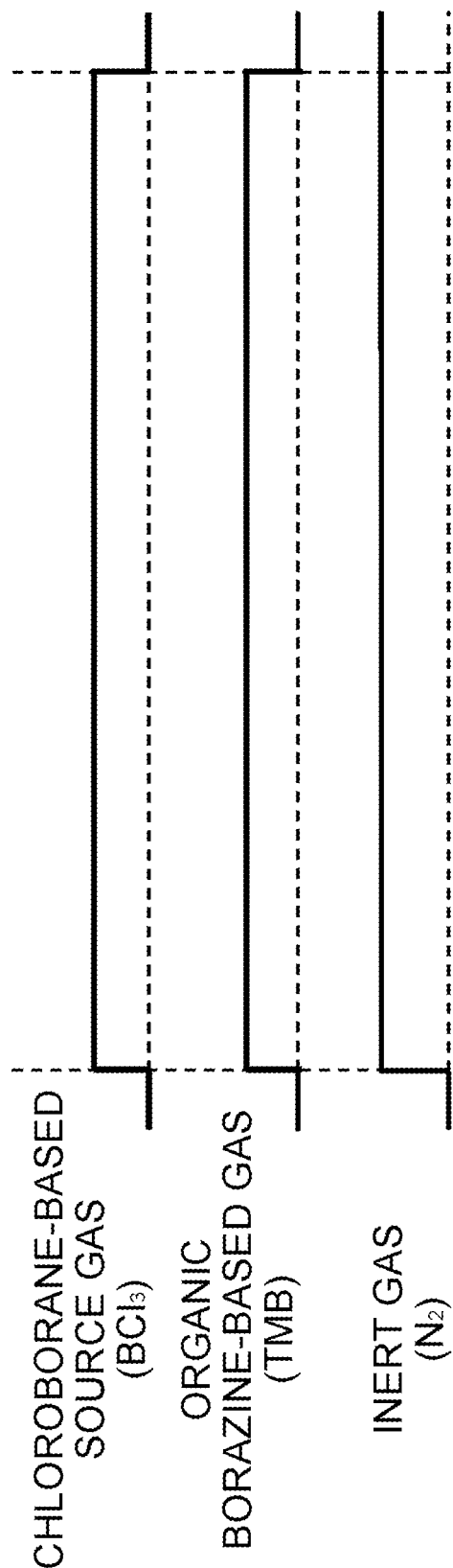

Although the above-described film forming sequence illustrated in FIGS. 4 and 5A has been described as a case in which a cycle including alternately performing step 1a and step 2a is performed at least once (a predetermined number of times), the present embodiment is not limited thereto. For example, a cycle including performing step 1a and step 2a simultaneously may be performed at least once (a predetermined number of times). FIG. 5B illustrates a case in which a cycle including performing step 1a and step 2a simultaneously is performed a plurality of times (n times), and FIG. 5C illustrates a case in which a cycle including performing step 1a and step 2a simultaneously is performed once. In a film forming sequence illustrated in FIG. 5B, a film thickness of a BCN film may be controlled by mainly adjusting the number of times the cycle is performed. In a film forming sequence illustrated in FIG. 5C, a film thickness of a BCN film may be controlled by mainly adjusting a time taken to perform a cycle (a gas supply time). In this case, process conditions may be set to be the same as those in the above-described film forming sequence illustrated in FIGS. 4 and 5A.

As described above, the effects according to the previous embodiment may also be derived even when $BCl_3$ gas and TMB gas are supplied simultaneously. However as in the previous embodiment, when $BCl_3$ gas and TMB gas are alternately supplied and the inside of the process chamber 201 is purged between the supply of the $BCl_3$ gas and the supply of TMB gas, the $BCl_3$ gas and the TMB gas can be appropriately reacted under a condition causing a surface reaction to be dominant, and the controllability of a film thickness may be improved.

Modified Example 2

In the above-described film forming sequence illustrated in FIGS. 4 and 5A, a case in which a gas containing an organic borazine compound (TMB gas) is used as a reactive gas has been described, but the present embodiment is not limited thereto. For example, a gas containing an inorganic borazine compound may be used as the reactive gas. By using the gas containing the inorganic borazine compound, i.e., a carbon-free borazine compound gas, as the reactive gas, when the first layer is modified in step 2a, the element C is not introduced into the first layer, so that the first layer is changed (modified) into a second layer including a borazine ring structure and containing boron and nitrogen, i.e., a BN layer containing a borazine ring structure. As a result, a BN film containing a borazine ring structure is formed on the wafer 200. In this case, process conditions may also be set to be the same as those in the above-described film forming sequence.

Second Embodiment of the Present Invention

Next, a second embodiment of the present invention will be described.

The previous first embodiment has been described as a case in which the BCN film containing the borazine ring structure is formed on the substrate by performing the cycle including steps 1a and 2a a predetermined number of times. The present embodiment, on the other hand, will be described as a case in which a cycle further including step 3b of supplying a nitriding gas to a substrate, in addition to steps 1b and 2b which are performed in the same manner as steps 1a and 2a described above, is performed a predetermined number of times to form a BCN film including a borazine ring structure or a thin film containing boron, nitrogen, and a borazine ring structure (hereinafter referred to as a BN film containing a borazine ring structure) on the substrate. For brevity, a BN film including a borazine ring structure may be referred to simply as a BN film.

(First Sequence)

Figure 6:
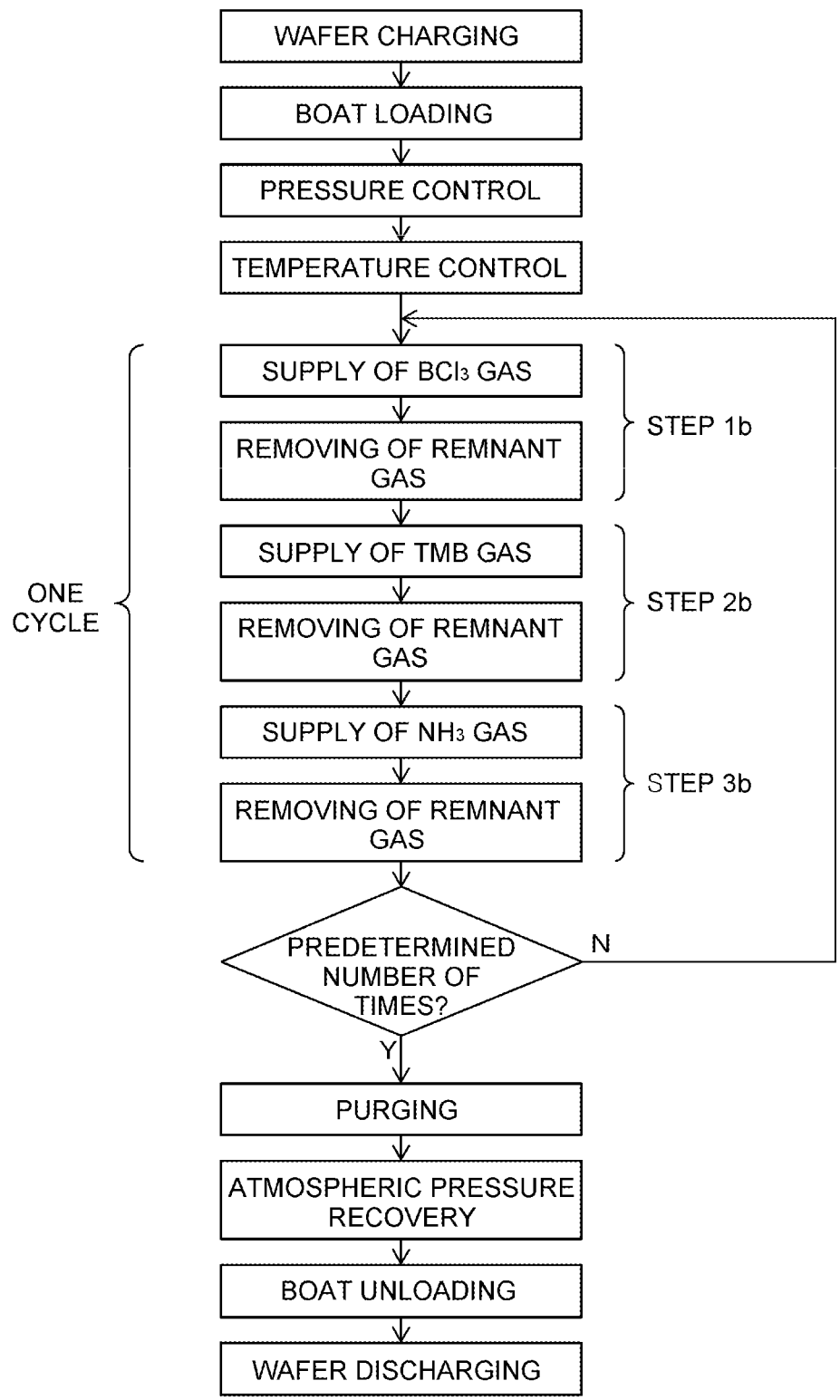
FIG. 6 is a flowchart of a film forming process in a first sequence of a second embodiment.

First, the first sequence of the present embodiment will be described with reference to FIGS. 6 and 7.

In the first sequence of the present embodiment, a BCN film including a borazine ring structure or a BN film including a borazine ring structure is formed on a wafer 200 by performing, a predetermined number of times, a cycle including a process of supplying a chloroborane-based source gas ($BCl_3$ gas) as a source gas containing boron and a halogen element (Cl) to a wafer 200; a process of supplying an organic borazine-based gas (TMB gas) as a reactive gas containing a borazine compound to the wafer 200; and a process of supplying a nitriding gas ($NH_3$ gas) to the wafer 200 under a condition where a borazine ring structure is retained in a borazine compound (TMB).

The present sequence is the same as the film forming sequence of the first embodiment except that the present sequence further includes step 3b in addition to steps 1b and 2b which are performed in the same manner as steps 1a and 2a. Hereinafter, step 3b of the present embodiment will be described.

[Step 3b] (Supply of $NH_3$ Gas)

After step 2b ends and the gas remaining in the process chamber 201 is eliminated, the valve 243c is opened to supply $NH_3$ gas into the gas supply pipe 232c. The $NH_3$ gas, the flow rate of which is adjusted by the MFC 241c, is supplied from the gas supply holes 250c into the buffer chamber 237. In this case, without applying RF power between the rod electrodes 269 and 270, the $NH_3$ gas supplied into the buffer chamber 237 is thermally activated, supplied from the gas supply hole 250e into the process chamber 201, and exhausted from the exhaust pipe 231 (refer to FIG. 7A). Also, by applying RF power via the matcher 272 from the RF power source 273 between the rod electrodes 269 and 270, the $NH_3$ gas supplied into the buffer chamber 237 is excited by plasma, supplied as an active species from the gas supply holes 250e into the process chamber 201, and exhausted from the exhaust pipe 231 (refer to FIG. 7B). In this case, $NH_3$ gas activated by heat or plasma is supplied to the wafer 200. At the same time, the valve 243h is opened to supply $N_2$ gas into the inert gas supply pipe 232h. The $N_2$ gas is supplied into the process chamber 201 together with the $NH_3$ gas and exhausted from the exhaust pipe 231.

Also, in this case, in order to prevent the $NH_3$ gas from flowing into the nozzles 249a, 249b, and 249d, the valves 243f, 243g, and 243i are opened to supply $N_2$ gas into the gas supply pipes 232f, 232g, and 232i. The $N_2$ gas is supplied into the process chamber 201 via the gas supply pipes 232a, 232b, and 232d and the nozzles 249a, 249b, and 249d, and exhausted from the exhaust pipe 231.

When the $NH_3$ gas is not plasma-excited but thermally activated and supplied, the inside pressure of the process chamber 201 is set to be within, for example, a range of 1 to 3,000 Pa by appropriately controlling the APC valve 244. By setting the inside pressure of the process chamber 201 to be within a relatively high pressure range, the $NH_3$ gas may be thermally activated using a non-plasma process. Also, when the $NH_3$ gas is thermally activated and supplied, a relatively soft reaction may be caused to softly perform a nitridation action which will be described below. A partial pressure of the $NH_3$ gas in the process chamber 201 is set to be within a range of, for example, 0.01 to 2,970 Pa. A supply flow rate of the $NH_3$ gas controlled by the MFC 241c is set, for example, to be within a range of 100 to 10,000 sccm. The supply flow rate of the $N_2$ gas controlled by each of the MFCs 241f to 241i is set, for example, to be within a range of 100 to 10,000 sccm. A duration for which the $NH_3$ gas activated by heat is supplied to the wafer 200, i.e., a gas supply time (gas irradiation time), is set to range, for example, from 1 to 120 seconds, and preferably 1 to 60 seconds. In this case, similar to steps 1b and 2b, the temperature of the heater 207 may be set such that the temperature of the wafer 200 is within a range of 250 to 700° C., preferably a range of 300 to 650° C., and more preferably a range of 350 to 600° C.

When the $NH_3$ gas is excited by plasma and supplied as an active species, the inside pressure of the process chamber 201 is set to be within, for example, a range of 1 to 100 Pa by appropriately controlling the APC valve 244. In this case, a partial pressure of the $NH_3$ gas in the process chamber 201 is set to be within a range of, for example, 0.01 to 100 Pa. A supply flow rate of the $NH_3$ gas controlled by the MFC 241c is set, for example, to be within a range of 100 to 10,000 sccm. The supply flow rate of the $N_2$ gas controlled by each of the MFCs 241h, 241f to 241i is set, for example, to be within a range of 100 to 10,000 sccm. A duration for which the active species obtained by activating the $NH_3$ gas by plasma is supplied to the wafer 200, i.e., a gas supply time (gas irradiation time), is set to range, for example, from 1 to 120 seconds, and preferably 1 to 60 seconds. In this case, similar to steps 1b and 2b, the temperature of the heater 207 may be set such that the temperature of the wafer 200 is within a range of 250 to 700° C., preferably a range of 300 to 650° C., and more preferably a range of 350 to 600° C. RF power applied from the RF power source 273 between the rod electrodes 269 and 270 is set to be within a range of, for example, 50 to 1,000 W.

In this case, the gas supplied into the process chamber 201 is $NH_3$ gas thermally activated by elevating the inside pressure of the process chamber 201 or an active species obtained by exciting $NH_3$ gas by plasma, and neither $BCl_3$ gas nor TMB gas is supplied into the process chamber 201. Accordingly, the $NH_3$ gas does not cause a vapor reaction, and the activated $NH_3$ gas or the active species of the $NH_3$ gas reacts with at least a portion of the second layer formed on the wafer 200 in step 2b. Thus, the second layer is nitrided and modified into a third layer (BCN layer) including a borazine ring structure and containing boron, carbon, and nitrogen or a third layer (BN layer) including a borazine ring structure and containing boron and nitrogen. The third layer is, for example, a layer having a thickness of less than one atomic layer to several atomic layers. In this case, the BCN layer or BN layer including the borazine ring structure may also be referred to as a layer containing boron, carbon, nitrogen, and the borazine ring structure or a layer containing boron, nitrogen, and the borazine ring structure.

In the process of forming the third layer, the second layer is modified under a condition where the borazine ring structure is retained in the second layer by a nitriding gas. That is, nitrogen is added to the second layer by nitriding the second layer. Also, at least a portion of carbon included in the second layer is separated (drawn) from the second layer due to the nitridation of the second layer. That is, a N concentration of the third layer becomes higher than a N concentration of the second layer, and a C concentration of the third layer becomes lower than a C concentration of the second layer. In this case, the borazine ring structure constituting a borazine ring included in the second layer is not broken but retained.

By supplying the $NH_3$ gas under the above-described conditions, the borazine ring structure in the second layer may not be broken but retained while appropriately reacting the second layer with the $NH_3$ gas, and the above-described reaction may be caused. Also, the most important factors (conditions) for causing the reaction while retaining the borazine ring structure in the second layer are regarded as a temperature of the wafer 200 and an inside pressure of the process chamber 201, especially the temperature of the wafer 200. By appropriately controlling the factors, an appropriate reaction may be caused.

As illustrated in FIG. 7A, the second layer may be thermally nitrided and modified (changed) into a third layer by activating $NH_3$ gas by heat and supplying the activated $NH_3$ gas into the process chamber 201. In this case, at least a portion of the element C in the second layer is deintercalated (drawn) due to energy of the activated $NH_3$ gas while increasing a content of the element N in the second layer, so that the second layer is modified into the third layer. Also, due to a thermal nitridation action using $NH_3$ gas, B—N bonds increase in the second layer, while B—C bonds and B—B bonds are reduced in the second layer, and a content of each of the elements C and B contained in the second layer is reduced. In particular, by deintercalating most of the element C, a content of the element C may be reduced to a level equal to the content of impurities. That is, the second layer may be modified into the third layer while varying a content ratio toward increasing a N concentration and reducing C and B concentrations. Also, by controlling process conditions, such as an inside pressure of the process chamber 201 or a gas supply time, a content of the element N (i.e., an N concentration) of the third layer may be finely adjusted, and a content ratio of the third layer may be controlled more precisely.

Figure 7B:
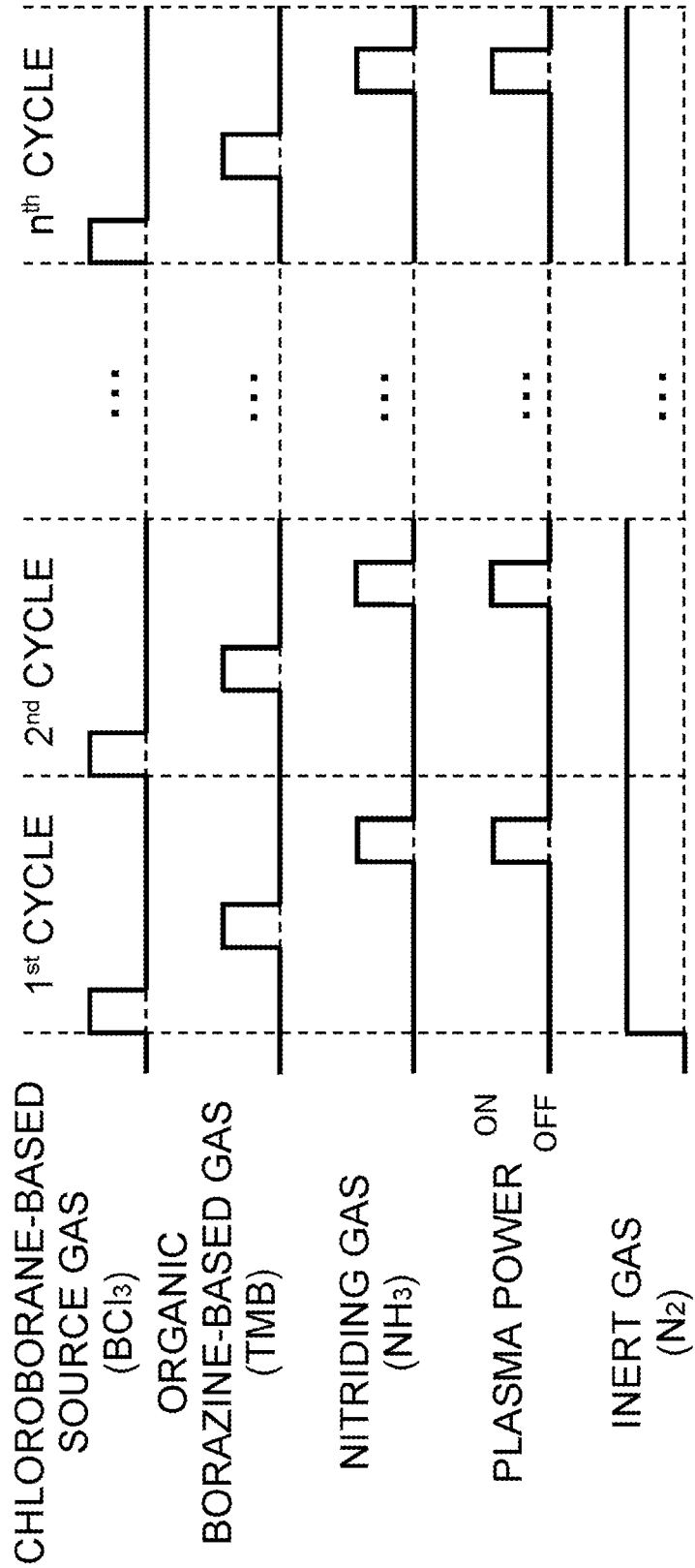
FIG. 7B illustrates an example of a sequence of forming a film using plasma.

In addition, as illustrated in FIG. 7B, by supplying an active species obtained by exciting $NH_3$ gas by plasma into the process chamber 201, the second layer may be nitrided by plasma and modified (changed) into a third layer. In this case, the second layer is modified (changed) into the third layer by deintercalating (drawing) at least a portion of the element C in the second layer due to energy of the active species while increasing a content of the element N in the second layer. Also, due to the plasma nitridation action using the $NH_3$ gas, B—N bonds increase in the second layer, while B—C bonds and B—B bonds are reduced in the second layer, and a content of each of the elements C and B contained in the second layer is reduced. In particular, by deintercalating most of the element C, a content of the element C may be reduced to a level equal to the content of impurities or the element C may be substantially annihilated. That is, the second layer may be modified into the third layer while varying a content ratio toward increasing an N concentration and reducing C and B concentrations. Also, by controlling process conditions, such as an inside pressure of the process chamber 201 or a gas supply time, a content of the element N (i.e., an N concentration) of the third layer may be finely adjusted, and a content ratio of the third layer may be controlled more strictly.

A nitridation reaction of the second layer is preferably not saturated. For example, when the second layer is formed to a thickness of less than one atomic layer to several atomic layers in step 1b and 2b, a portion of the second layer is preferably nitrided. In this case, nitridation is performed under a condition where the nitridation reaction of the second layer is unsaturated, so as not to nitride the entire second layer having a thickness of less than one atomic layer to several atomic layers.

Although process conditions of step 3b may be set as described above to cause the nitridation reaction of the second layer to be unsaturated, the process conditions of step 3b may be set to be the following process conditions so that the nitridation reaction of the second layer can be easily unsaturated.

When $NH_3$ gas is thermally activated and supplied:
Wafer temperature: 500 to 650° C.
Inside pressure of the process chamber: 133 to 2,666 Pa
$NH_3$ gas partial pressure: 33 to 2,515 Pa
$NH_3$ gas supply flow rate: 1,000 to 5,000 sccm
$N_2$ gas supply flow rate: 300 to 3,000 sccm
$NH_3$ gas supply time: 6 to 60 seconds
When $NH_3$ gas is activated by plasma and supplied:
Wafer temperature: 500 to 650° C.
Inside pressure of the process chamber: 33 to 80 Pa
$NH_3$ gas partial pressure: 17 to 75 Pa
$NH_3$ gas supply flow rate: 1,000 to 5,000 sccm
$N_2$ gas supply flow rate: 300 to 1,000 sccm
$NH_3$ gas supply time: 6 to 60 seconds (Removing of Remnant Gas)

After the third layer is formed, the valve 243c is closed and the supply of the $NH_3$ gas is stopped. In this case, the inside of the process chamber 201 is vacuum-exhausted by the vacuum pump 246 while the APC valve 244 is open, thereby eliminating the $NH_3$ gas (that does not react or that has contributed to the formation of the third layer) or byproducts remaining in the process chamber 201 from the process chamber 201. In this case, $N_2$ gas is continuously supplied into the process chamber 201 while the valves 243f to 243i are open. The $N_2$ gas acts as a purge gas to increase the effect of eliminating the $NH_3$ gas (that does not react or that has contributed to the formation of the third layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1b to be performed thereafter will not be badly influenced by the gas. In this case, the flow rate of the $N_2$ gas to be supplied into the process chamber 201 need not be high. For example, the inside of the process chamber 201 may be purged without causing step 1b to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the nitriding gas (nitrogen-containing gas), not only $NH_3$ gas but also diazene ($N_2H_2$) gas, hydrazine ($N_2H_4$) gas, $N_3H_8$ gas, or a gas containing a combination thereof may be used. As the inert gas, not only the $N_2$ gas but also a rare gas, such as Ar gas, He gas, Ne gas, Xe gas, etc. may be used.

(Performing a Cycle a Predetermined Number of Times)

A BCN film or BN film including a borazine ring structure may be formed to have a predetermined composition and a predetermined thickness on the wafer 200 by performing a cycle including steps 1b to 3b described above at least once (a predetermined number of times). The cycle described above is preferably performed a plurality of times. That is, a thickness of a BCN or BN layer to be formed per cycle may be set to be less than a desired thickness and the cycle may be performed a plurality of times until the BCN film has the desired thickness.

(Second Sequence)

Figure 8:
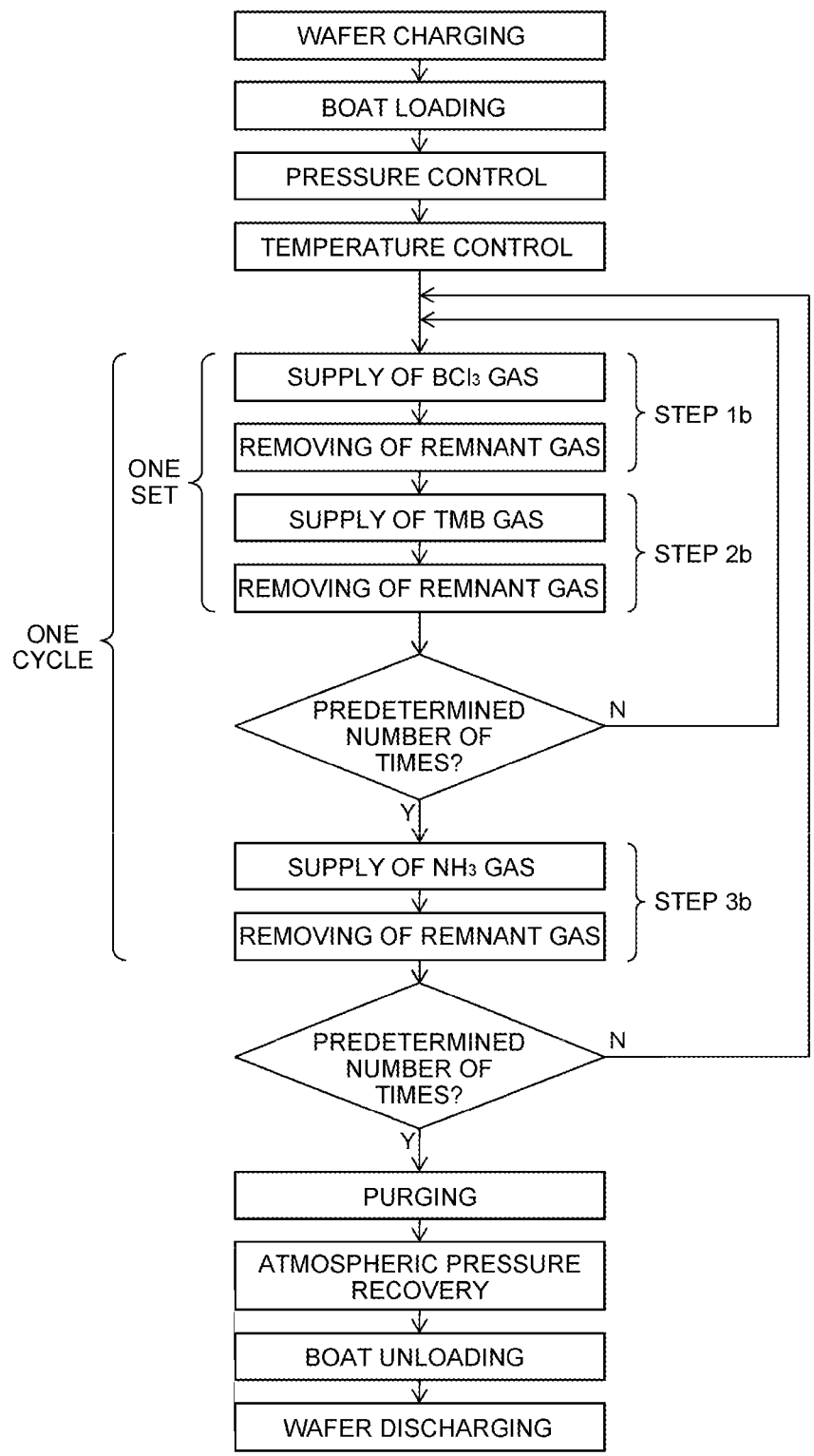
FIG. 8 is a flowchart of a film forming process in a second sequence of the second embodiment.

Next, a second sequence of the present embodiment will be described with reference to FIGS. 8 and 9.

In the second sequence of the present embodiment, a BCN film including a borazine ring structure or a BN film including a borazine ring structure is formed on a wafer 200 by performing, a predetermined number of times, a cycle including a process of alternately performing a process of supplying a chloroborane source gas ($BCl_3$ gas) as a source gas containing boron and a halogen element (Cl) and a process of supplying an organic borazine-based gas (TMB gas) as a reactive gas containing a borazine compound to the wafer 200 a predetermined number of times; and a process of supplying a nitriding gas ($NH_3$ gas) to the wafer 200 under a condition where a borazine ring structure is retained in a borazine compound (TMB).

Figure 9A:
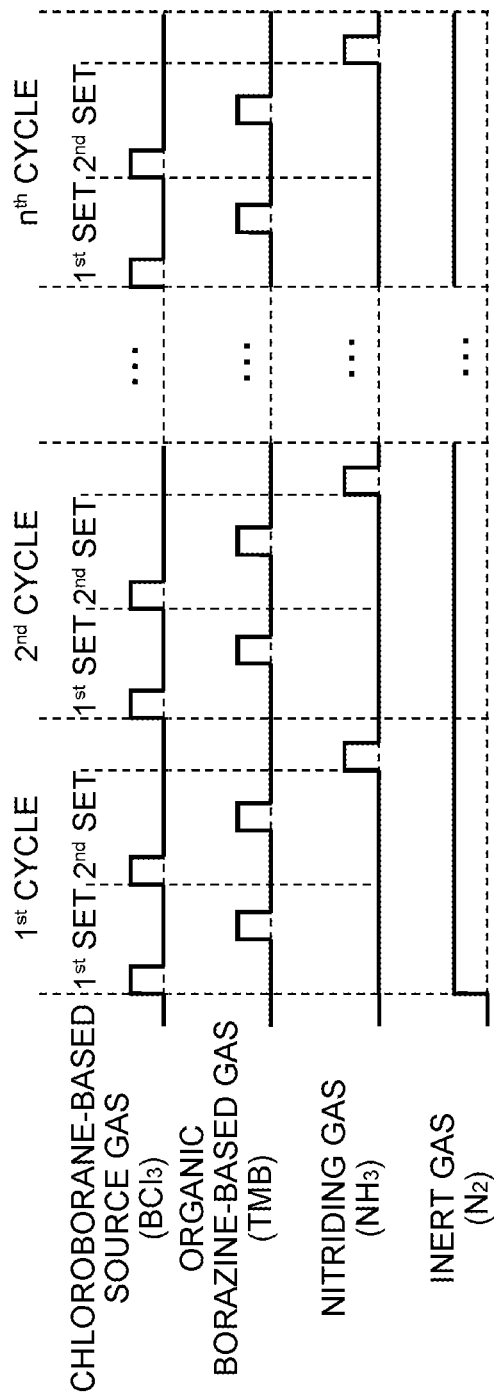
FIG. 9A illustrates an example of a sequence of forming a film using a non-plasma process.
Figure 9B:
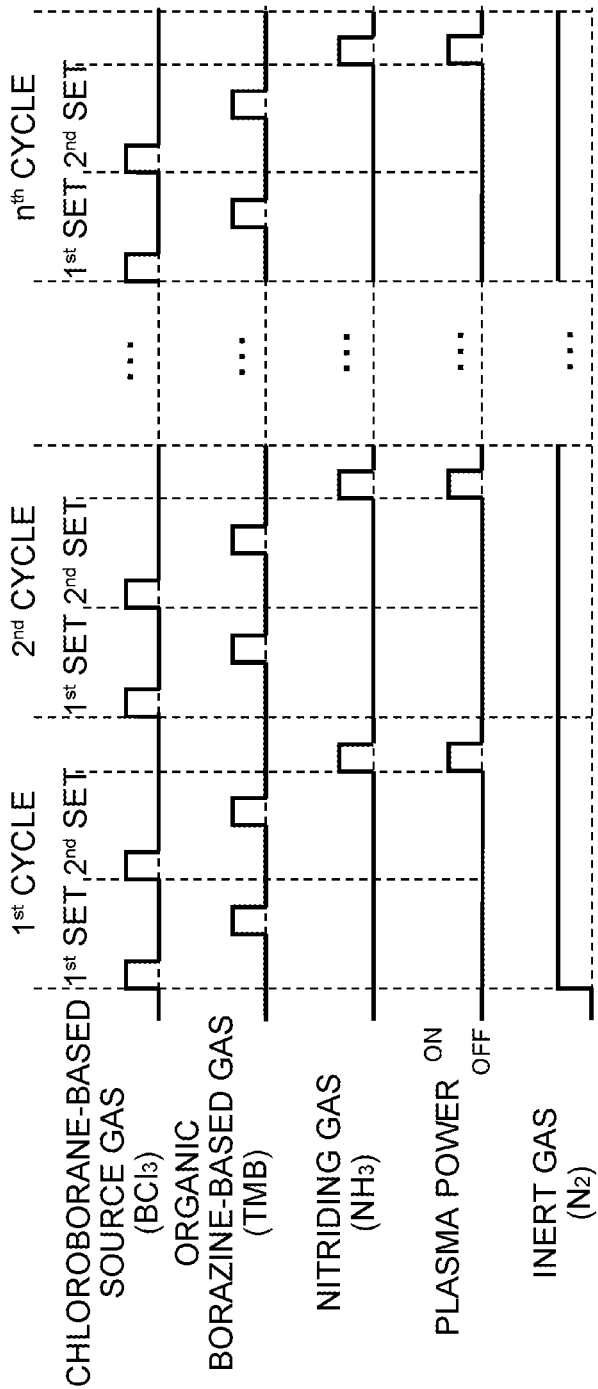
FIG. 9B illustrates an example of a sequence of forming a film using plasma.

FIG. 9 illustrates a case in which a BCN film or BN film including a borazine ring structure is formed on the wafer 200 to have a predetermined composition and a predetermined thickness by performing, n times, a cycle including performing a set including step 1b and step 2b described above twice and performing step 3b. The present sequence may be the same as the first sequence except that after one set including step 1b and 2b described above is repeated a plurality of times, step 3b is performed. Also, in the present sequence, process conditions may be set to be the same as those in the first sequence described above.

(Effects of the Present Embodiment)

According to a film forming sequence of the present embodiment, the effects according to the previous first embodiment may also be derived. Also, according to the film forming sequence of the present embodiment, a content ratio of the BCN film or BN film may be finely adjusted as described above by performing step 3b of supplying $NH_3$ gas to the wafer 200.

Modified Example

In the first and second sequences illustrated in FIGS. 6 through 9, a case in which gas containing an organic borazine compound (TMB gas) is used as a reactive gas has been described, but the present embodiment is not limited thereto. For example, a gas containing an inorganic borazine compound may be used as the reactive gas. By using the gas containing the inorganic borazine compound, i.e., a carbon-free borazine compound gas, as the reactive gas, when the first layer is modified in step 2b, the element C is not introduced into the first layer, so that the first layer is changed (modified) into a second layer including a borazine ring structure and containing boron and nitrogen, i.e., a BN layer containing a borazine ring structure. As a result, a BN film containing a borazine ring structure is formed on the wafer 200. In this case, process conditions may also be set to be the same as those in the above-described film forming sequence.

Third Embodiment of the Present Invention

Next, a third embodiment of the present embodiment will be described.

The previous first embodiment has been described as a case in which a BCN film including a borazine ring structure is formed on a substrate by performing a cycle including step 1a and step 2a a predetermined number of times. The present embodiment, on the other hand, will be described as a case in which a BCN film including a borazine ring structure is formed on a substrate by performing, a predetermined number of times, a cycle including performing step 2c of supplying a carbon-containing gas to the substrate between steps 1c and 3c which are performed in the same manner as steps 1a and 2a described above.

Figure 10:
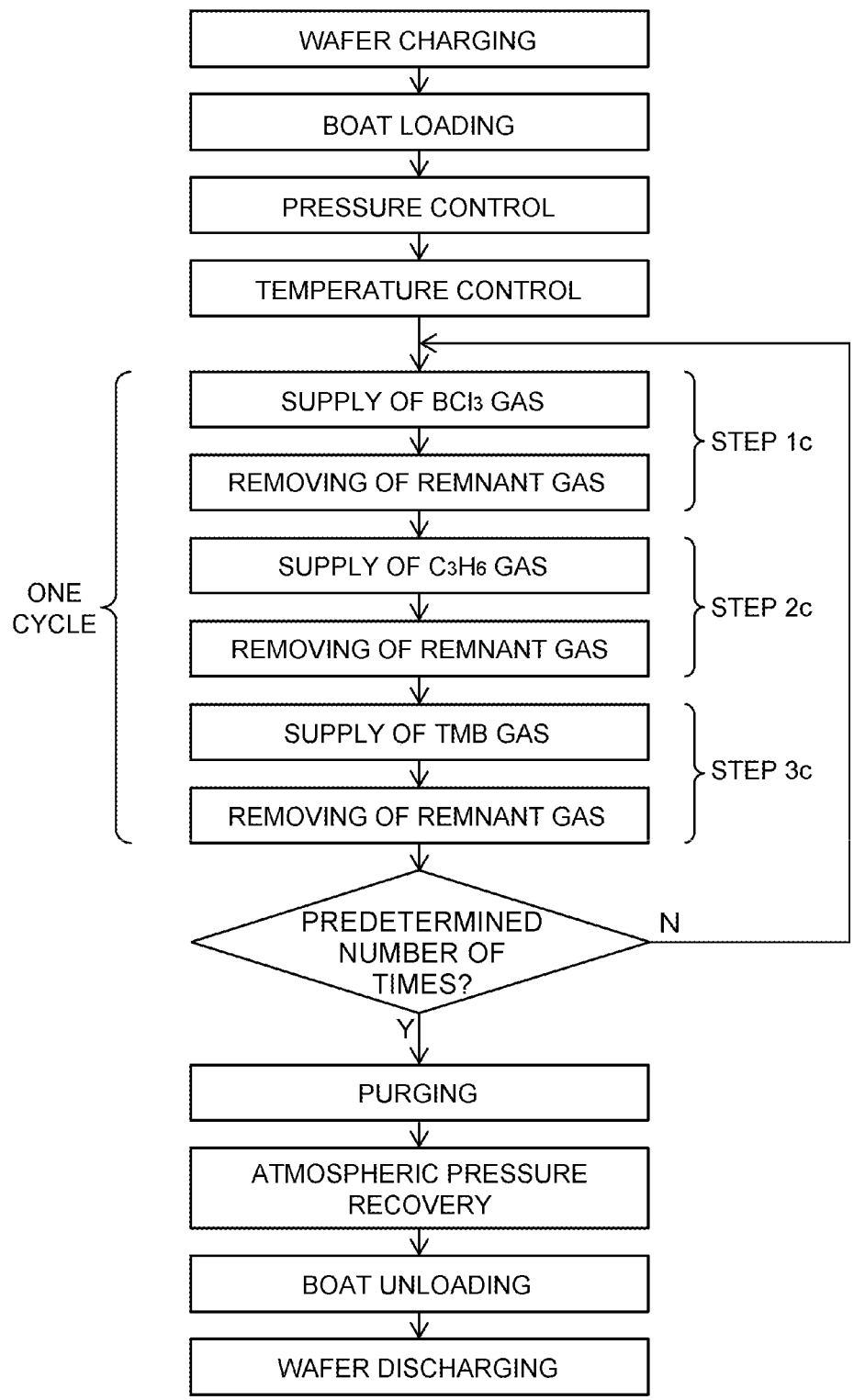
FIG. 10 is a flowchart of a film forming process in a film forming sequence of a third embodiment.

Hereinafter, a film forming sequence of the present embodiment will be described with reference to FIGS. 10 and 11A.

In the film forming sequence of the present embodiment, a BCN film including a borazine ring structure is formed on a wafer 200 by performing, a predetermined number of times, a cycle including a process of supplying a chloroborane-based source gas ($BCl_3$ gas) as a source gas containing boron and a halogen element (Cl) to the wafer 200; a process of supplying a carbon-containing gas ($C_3H_6$ gas) to the wafer 200; and a process of supplying an organic borazine-based gas (TMB gas) as a reactive gas containing a borazine compound to the wafer 200 under a condition where a borazine ring structure is retained in a borazine compound (TMB).

The film forming sequence of the present embodiment is the same as the film forming sequence of the first embodiment except that step 2c is performed between steps 1c and 3c which are performed in the same manner as steps 1a and 2a, and a layer obtained by forming a carbon-containing layer on a first layer is modified due to a reaction of the layer obtained by forming the carbon-containing layer on the first layer with the borazine compound in step 3c which is performed in the same manner as step 2a. Hereinafter, steps 2c and 3c of the present embodiment will be described.

[Step 2c] (Supply of $C_3H_6$ Gas)

After step 1c ends and the gas remaining in the process chamber 201 is eliminated, the valve 243d is opened to supply $C_3H_6$ gas into the gas supply pipe 232d. The $C_3H_6$ gas, the flow rate of which is adjusted by the MFC 241d, is supplied from the gas supply holes 250d into the process chamber 201. The $C_3H_6$ gas supplied into the process chamber 201 is thermally activated and exhausted from the exhaust pipe 231. In this case, the thermally activated $C_3H_6$ gas is supplied to the wafer 200. At the same time, the valve 243i is opened to supply $N_2$ gas into the gas supply pipe 232i. The $N_2$ gas is supplied into the process chamber 201 together with the $C_3H_6$ gas and exhausted from the exhaust pipe 231.

Also, in this case, in order to prevent the $C_3H_6$ gas from flowing into the nozzles 249a to 249c and the buffer chamber 237, the valves 243f to 243h are opened to supply $N_2$ gas into the gas supply pipes 232f to 232h. The $N_2$ gas is supplied into the process chamber 201 via the gas supply pipes 232a to 232c, the nozzles 249a to 249c, and the buffer chamber 237, and exhausted from the exhaust pipe 231.

In this case, the inside pressure of the process chamber 201 is set to be within, for example, a range of 1 to 6,000 Pa by appropriately controlling the APC valve 244. The supply flow rate of the $C_3H_6$ gas controlled by the MFC 241d is set, for example, to be within a range of 100 to 10,000 sccm. The supply flow rate of the $N_2$ gas controlled by each of the MFCs 241f to 241i is set, for example, to be within a range of 100 to 10,000 sccm. In this case, a partial pressure of the $C_3H_6$ gas in the process chamber 201 is set to be within a range of, for example, 0.01 to 5,941 Pa. A duration for which the $C_3H_6$ gas is supplied to the wafer 200, i.e., a gas supply time (gas irradiation time), is set to be within, for example, a range of 1 to 120 seconds, and preferably a range of 1 to 60 seconds. In this case, similar to step 1c, the temperature of the heater 207 is set such that the temperature of the wafer 200 falls within, for example, a range of 250 to 700° C., preferably 300 to 650° C., and more preferably 350 to 600° C. Also, when the $C_3H_6$ gas is thermally activated and supplied, a soft reaction may be caused to facilitate formation of a carbon-containing layer which will be described below.

In this case, gas supplied into the process chamber 201 is thermally activated $C_3H_6$ gas, and $BCl_3$ gas is not supplied into the process chamber 201. Accordingly, the $C_3H_6$ gas does not cause a vapor reaction, and the activated $C_3H_6$ gas is supplied to the wafer. In this case, a carbon-containing layer having a thickness of less than one atomic layer, i.e., a discontinuous carbon-containing layer, is formed on the first layer formed on the wafer 200 in step 1c. Thus, a layer obtained by forming the carbon-containing layer on a layer containing boron, chlorine, and carbon, i.e., the first layer (hereinafter referred to as a first layer including the carbon-containing layer) is formed. Furthermore, depending on conditions, a portion of the first layer reacts with $C_3H_6$ gas to modify (carbonize) the first layer, and a chlorine-containing boron carbide layer (chlorine-containing BC layer) may be formed as a layer containing boron, chlorine, and carbon.

The carbon-containing layer formed on the first layer may be a carbon layer or a chemical adsorption layer of a carbon-containing gas ($C_3H_6$ gas), i.e., a chemical adsorption layer of a substance ($C_xH_y$) into which $C_3H_6$ is decomposed. Here, the carbon layer should be a discontinuous layer formed of carbon. Also, a $C_xH_y$ chemical adsorption layer should be a discontinuous chemical adsorption layer of $C_xH_y$ molecules. When the carbon-containing layer formed on the first layer is a continuous layer, for example, when a $C_xH_y$ continuous chemical adsorption layer is formed on the first layer by saturating a state of adsorption of $C_xH_y$ onto the first layer, the entire surface of the first layer is coated with the $C_xH_y$ chemical adsorption layer. In this case, there is no boron or chlorine on the surface of the first layer including the carbon-containing layer. As a result, it may be difficult to cause a modification reaction of the first layer including the carbon-containing layer in step 3c which will be described below. Under process conditions described above, the reactive gas including the borazine compound binds with boron or chlorine, but it is difficult to bind the reactive gas including the borazine compound with carbon. To cause a desired modification reaction in step 3c which will be described below, boron and chlorine need to be exposed on the surface of the first layer including the carbon-containing layer by causing a state of adsorption of $C_xH_y$ onto the first layer to be unsaturated.

Although process conditions of step 2c may be set as described above to cause the adsorption of the $C_xH_y$ onto the first layer to be unsaturated, the process conditions of step 2c may be set to be the following process conditions so that the adsorption of $C_xH_y$ onto the first layer can be easily unsaturated.

Wafer temperature: 500 to 650° C.
Inside pressure of the process chamber: 133 to 5,332 Pa
$C_3H_6$ gas partial pressure: 33 to 5,177 Pa
$C_3H_6$ gas supply flow rate: 1,000 to 10,000 sccm
$N_2$ gas supply flow rate: 300 to 3,000 sccm
$C_3H_6$ gas supply time: 6 to 200 seconds (Removing of Remnant Gas)

After the carbon-containing layer is formed on the first layer, the valve 243d is closed and the supply of the $C_3H_6$ gas is stopped. In this case, the inside of the process chamber 201 is vacuum-exhausted by the vacuum pump 246 while the APC valve 244 is open, thereby eliminating the $C_3H_6$ gas (that does not react or that has contributed to the formation of the carbon-containing layer) or byproducts remaining in the process chamber 201 from the process chamber 201. In this case, $N_2$ gas is continuously supplied as an inert gas into the process chamber 201 while the valves 243f to 243i are open. The $N_2$ gas acts as a purge gas to increase the effect of eliminating the $C_3H_6$ gas (that does not react or that has contributed to the formation of the carbon-containing layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 3c to be performed thereafter will not be badly influenced by the gas. In this case, the flow rate of the $N_2$ gas to be supplied into the process chamber 201 need not be high. For example, the inside of the process chamber 201 may be purged without causing step 3c to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the carbon-containing gas, not only propylene ($C_3H_6$) gas but also a hydrocarbon-based gas, such as acetylene ($C_2H_2$) gas or ethylene ($C_2H_4$) gas, may be used. The carbon-containing gas acts as a carbon supplying source (carbon source). By using a nitrogen-free hydrocarbon-based gas as the carbon-containing gas, it becomes easy to control a composition of the BCN film toward increasing a content of the element C in the BCN film while controlling an increase in the element N in the BCN film.

[Step 3c] (Supply of TMB Gas)

After step 2c ends and the gas remaining in the process chamber 201 is eliminated, step 3c of supplying TMB gas to the wafer 200 in the process chamber 201 is performed. Step 3c is performed in the same manner as step 2a of the first embodiment.

By supplying TMB gas to the wafer 200 in the same sequential order under the same conditions as in step 2a, the first layer including the carbon-containing layer formed on the wafer 200 in step 2c reacts with the TMB gas. That is, chlorine (a chloro group) present on an exposed surface of the first layer including the carbon-containing layer may react with a ligand (a methyl group) contained in TMB. Also, the caused reaction is the same as the reaction of the first layer with the TMB gas in step 2a of the first embodiment.

Due to a series of reactions, a borazine ring is newly introduced into the first layer including the carbon-containing layer, and the first layer including the carbon-containing layer is changed (modified) into a second layer including a borazine ring structure and containing boron, carbon, and nitrogen, that is, a BCN layer including a borazine ring structure. The second layer becomes, for example, a layer having a thickness of less than one atomic layer to several atomic layers. Also, step 3c of the present embodiment is the same as step 2a of the first embodiment in that the element B and the element N constituting the borazine ring or the element C contained in the ligand of TMB are newly introduced into the first layer including the carbon-containing layer, that is, in that the second layer becomes a boron-rich layer as compared with the first layer. Also, step 3c of the present embodiment is the same as step 2a of the first embodiment in that the second layer becomes a layer containing a low content of impurities, such as chlorine, and becomes a porous layer.

(Removing of Remnant Gas)

Thereafter, the TMB gas (that does not react or that has contributed to the reaction) or byproducts remaining in the process chamber 201 are eliminated from the process chamber 201 in the same sequential order under the same conditions as in step 2a of the first embodiment. In this case, similar to step 2a of the first embodiment, the gas remaining in the process chamber 201 may not be completely eliminated and the inside of the process chamber 201 may not be completely purged.

(Performing a Cycle a Predetermined Number of Times)

A BCN film including a borazine ring structure may be formed on the wafer 200 to have a predetermined composition and a predetermined film thickness by performing a cycle including steps 1c to 3c described above at least once (a predetermined number of times). Also, the cycle described above is preferably performed a plurality of times. That is, a thickness of a BCN layer including a borazine ring structure to be formed per cycle may be set to be less than a desired thickness and the cycle may be performed a plurality of times until the BCN film has the desired thickness.

(Effects of the Present Embodiment)

According to the film forming sequence of the present embodiment, the effects according to the previous first embodiment may also be derived. Also, according to the film forming sequence of the present embodiment, by performing step 2c of supplying $C_3H_6$ gas to the wafer 200 after performing step 1c of forming the first layer on the wafer 200, i.e., by forming a film using two kinds of carbon sources (a double carbon source) during one cycle, not only the element C contained in the TMB gas but also the element C contained in the $C_3H_6$ gas may be newly added to the BCN film. That is, a carbon (C) concentration in the BCN film may be controlled to be higher than when a film is formed using one kind of carbon source (a single carbon source) during one cycle.

Modified Example

Figure 11B:
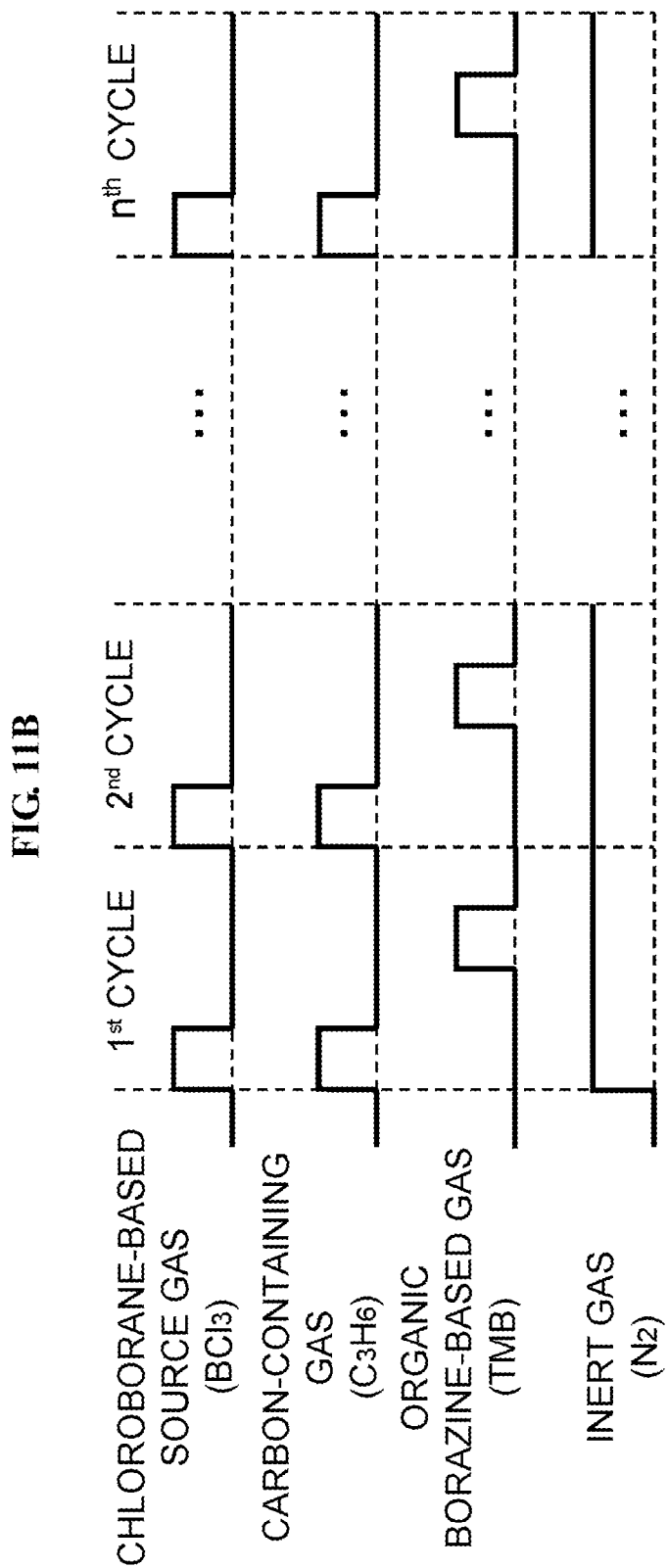

In the film forming sequence illustrated in FIG. 11A, a case in which a process of supplying $C_3H_6$ gas between a process of supplying $BCl_3$ gas and a process of supplying TMB gas has been described, but the present embodiment is not limited thereto. For example, as illustrated in FIG. 11B, the process of supplying $C_3H_6$ gas may be performed during the process of supplying the $BCl_3$ gas. Also, for example, as illustrated in FIG. 11C, the process of supplying $C_3H_6$ gas may be performed during the process of supplying the TMB gas. That is, the $C_3H_6$ gas may be supplied not only for a period during which the supply of $BCl_3$ gas or TMB gas is stopped but also for a period during which the $BCl_3$ gas or TMB gas is supplied. However, performing the supply of the $C_3H_6$ gas during the supply of the TMB gas is more preferable than performing the supply of the $C_3H_6$ gas during the supply of the $BCl_3$ gas because a vapor reaction between the $BCl_3$ gas and the $C_3H_6$ gas may be avoided in the process chamber 201, that is, because generation of particles may be inhibited in the process chamber 201.

Fourth Embodiment of the Present Invention

Next, a fourth embodiment of the present invention will be described.

The previous first embodiment has been described as a case in which a BCN film including a borazine ring structure is formed on a substrate by performing a cycle including step 1a and step 2a a predetermined number of times. The present embodiment, on the other hand, will be described as a case in which a BCN film including a borazine ring structure is formed on a substrate by performing, a predetermined number of times, a cycle further including step 3d of supplying an amine-based gas as a gas containing nitrogen and carbon to the substrate in addition to steps 1d and 2d which are performed in the same manner as steps 1a and 2a described above.

(First Sequence)

Figure 12:
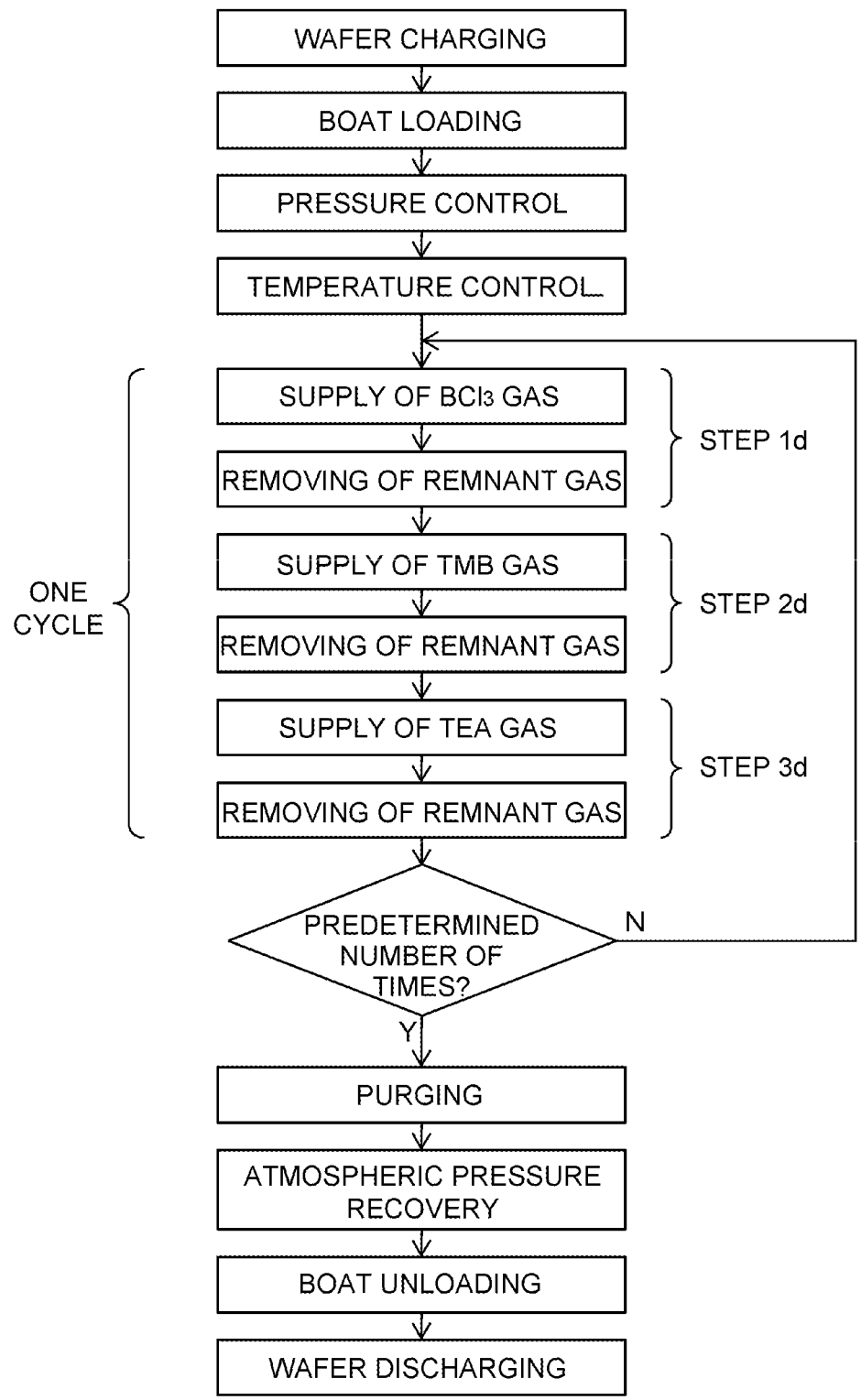
FIG. 12 is a flowchart of a film forming process in a first sequence of a fourth embodiment.

First, a first sequence of the present embodiment will be described with reference to FIGS. 12 and 13.

In the first sequence of the present embodiment, a BCN film including a borazine ring structure is formed on a wafer 200 by performing, a predetermined number of times, a cycle including a process of supplying a chloroborane-based source gas ($BCl_3$ gas) as a source gas containing boron and a halogen element (Cl) to a wafer 200; a process of supplying an organic borazine-based gas (TMB gas) as a reactive gas containing a borazine compound to the wafer 200; and a process of supplying an amine-based gas (TEA gas) as gas containing nitrogen and carbon to the wafer 200 under a condition where a borazine ring structure is retained in a borazine compound (TMB).

The first sequence of the present embodiment is the same as the film forming sequence of the first embodiment except that the first sequence of the present embodiment further includes step 3d in addition to steps 1d and 2d which are performed in the same manner as steps 1a and 2a. Hereinafter, step 3d of the present embodiment will be described.

[Step 3d](Supply of TEA Gas)

After step 2d ends and the gas remaining in the process chamber 201 is eliminated, the valve 243e is opened to supply TEA gas into the gas supply pipe 232e. The TEA gas, the flow rate of which is adjusted by the MFC 241e, flows into the gas supply pipe 232d and is supplied from the gas supply holes 250d into the process chamber 201. The TEA gas supplied into the process chamber 201 is thermally activated and exhausted from the exhaust pipe 231. In this case, the thermally activated TEA gas is supplied to the wafer 200. At the same time, the valve 243i is opened to supply $N_2$ gas into the gas supply pipe 232i. The $N_2$ gas is supplied into the process chamber 201 together with the TEA gas, and exhausted from the exhaust pipe 231.

In this case, in order to prevent the TEA gas from flowing into the nozzles 249a to 249c and the buffer chamber 237, the valves 243f to 243h are opened to supply $N_2$ gas into the gas supply pipes 232f to 232h. The $N_2$ gas is supplied into the process chamber 201 via the gas supply pipes 232a to 232c, the nozzles 249a to 249c, and the buffer chamber 237 and is then exhausted from the exhaust pipe 231.

In this case, the APC valve 244 is appropriately adjusted to set the inside pressure of the process chamber 201 to be within a range of, for example, 1 to 6,000 Pa. The supply flow rate of the TEA gas controlled by the MFC 241e is set to be within, for example, a range of 100 to 10,000 sccm. The supply flow rate of the $N_2$ gas controlled by each of the MFCs 241f to 241i is set to be within, for example, a range of 100 to 10,000 sccm. A partial pressure of the TEA gas in the process chamber 201 is set to be within a range of, for example, 0.01 to 5,941 Pa. A duration for which the TEA gas is supplied to the wafer 200, i.e., a gas supply time (gas irradiation time), is set to be within, for example, a range of 1 to 200 seconds, preferably a range of 1 to 120 seconds, and more preferably a range of 1 to 60 seconds. In this case, similar to step 1d, the temperature of the heater 207 is set such that the temperature of the wafer 200 falls within, for example, a range of 250 to 700° C., preferably 300 to 650° C., and more preferably 350 to 600° C.

In this case, gas supplied into the process chamber 201 is thermally activated TEA gas, and neither $BCl_3$ gas nor TMB gas is supplied into the process chamber 201. Accordingly, the TEA gas does not cause a vapor reaction, and the activated TEA gas reacts with at least a portion of the second layer, which is formed on the wafer 200, includes a borazine ring structure, and contains boron, carbon, and nitrogen, in step 2d. Thus, the second layer is modified into a third layer (BCN layer) including a borazine ring structure and containing boron, carbon, and nitrogen. The third layer is, for example, a layer having a thickness of less than one atomic layer to several atomic layers. Also, the third layer has a different content ratio from the second layer. For example, the third layer has higher C and N concentrations than the second layer.

In the process of forming the third layer, the second layer is modified by reacting the second layer with the TEA gas under a condition where the borazine ring structure is retained in the second layer. That is, by adding nitrogen and carbon contained in the TEA gas to the second layer, each of the element N and the element C of the modified second layer, i.e., the third layer, is increased. In this case, the borazine ring structure constituting a borazine ring included in the second layer is not broken but retained. Furthermore, since the TEA gas is thermally activated and supplied, an action of deintercalating (drawing) the element C from the second layer may be relatively alleviated, so it becomes easy to control a composition of the third layer toward increasing a content of the element C in the third layer.

By supplying the TEA gas under the above-described conditions, the borazine ring structure in the second layer may not be broken but retained while appropriately reacting the second layer with the TEA gas, and the above-described reaction may be caused. Also, the most important factors (conditions) for causing the reaction while retaining the borazine ring structure in the second layer are regarded as a temperature of the wafer 200 and an inside pressure of the process chamber 201, especially the temperature of the wafer 200. By appropriately controlling the factors, an appropriate reaction may be caused.

A modification reaction of the second layer is preferably not saturated. For example, when the second layer is formed to a thickness of less than one atomic layer to several atomic layers in step 1d and 2d, a portion of the second layer is preferably modified. In this case, modification is performed under a condition where the modification reaction of the second layer is unsaturated, so as not to modify the entire second layer having a thickness of less than one atomic layer to several atomic layers.

Although process conditions of step 3d may be set as described above to cause the modification reaction of the second layer to be unsaturated, the process conditions of step 3d may be set to be the following process conditions so that the modification reaction of the second layer can be easily unsaturated.

Wafer temperature: 500 to 650° C.
Inside pressure of the process chamber: 133 to 5,332 Pa
TEA gas partial pressure: 33 to 5,177 Pa
TEA gas supply flow rate: 1,000 to 10,000 sccm
$N_2$ gas supply flow rate: 300 to 3,000 sccm
TEA gas supply time: 6 to 200 seconds
(Removing of Remnant Gas)

After the third layer is formed on the wafer 200, the valve 243e is closed and the supply of the TEA gas is stopped. In this case, the inside of the process chamber 201 is vacuum-exhausted by the vacuum pump 246 while the APC valve 244 is open, thereby eliminating the TEA gas (that does not react or that has contributed to the formation of the third layer) or byproducts remaining in the process chamber 201 from the process chamber 201. In this case, $N_2$ gas is continuously supplied as an inert gas into the process chamber 201 while the valves 243f to 243i are open. The $N_2$ gas acts as a purge gas to increase the effect of eliminating the TEA gas (that does not react or that has contributed to the formation of the third layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1d to be performed thereafter will not be badly influenced by the gas. In this case, the flow rate of the $N_2$ gas to be supplied into the process chamber 201 need not be high. For example, the inside of the process chamber 201 may be purged without causing step 1d to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the amine-based gas, for example, not only TEA but also an ethylamine-based gas obtained by vaporizing diethylamine [$(C_2H_5)_2NH$, abbreviated as DEA], monoethylamine ($C_2H_5NH_2$, abbreviated as MEA), etc., a methylamine-based gas obtained by vaporizing trimethylamine [$(CH_3)_3N$, abbreviated as TMA], dimethylamine [$(CH_3)_2NH$, abbreviated as DMA], monomethylamine ($CH_3NH_2$, abbreviated as MMA), etc., a propylamine-based gas obtained by vaporizing tripropylamine [$(C_3H_7)_3N$, abbreviated as TPA], dipropylamine [$(C_3H_7)_2NH$, abbreviated as DPA], monopropylamine ($C_3H_7NH_2$, abbreviated as MPA), etc., an isopropylamine-based gas obtained by vaporizing triisopropylamine ([$(CH_3)_2CH]_3N$, abbreviated as TIPA), diisopropylamine ([$(CH_3)_2CH]_2NH$, abbreviated as DIPA), monoisopropylamine [$(CH_3)_2CHNH_2$, abbreviated as MIPA], etc., a butylamine-based gas obtained by vaporizing tributylamine [$(C_4H_9)_3N$, abbreviated as TBA], dibutylamine [$(C_4H_9)_2NH$, abbreviated as DBA], monobutylamine ($C_4H_9NH_2$, abbreviated as MBA), etc., or an isobutylamine-based gas obtained by vaporizing triisobutylamine ([$(CH_3)_2CHCH_2]_3N$, abbreviated as TIBA), diisobutylamine ([$(CH_3)_2CHCH_2]_2NH$, abbreviated as DIBA), monoisobutylamine [$(CH_3)_2CHCH_2NH_2$, abbreviated as MIBA], etc., may be preferably used. That is, as the amine-based gas, for example, at least one of gases obtained by vaporizing $(C_2H_5)_xNH_{3-x}$, $(CH_3)_xNH_{3-x}$, $(C_3H_7)_xNH_{3-x}$, [$(CH_3)_2CH]_xNH_{3-x}$, $(C_4H_9)_xNH_{3-x}$, and [$(CH_3)_2CHCH_2]_xNH_{3-x}$ (in these formulae, x is an integer ranging from 1 to 3) may be preferably used as the amine-based gas.

The amine-based gas acts not only as a nitrogen source but also as a carbon source. By using the amine-based gas as gas containing nitrogen and carbon, it becomes easy to control a composition of the BCN film toward increasing contents of the element C and the element N in the BCN film.

A gas containing an organic hydrazine compound, i.e., an organic hydrazine-based gas, may be used as a gas containing nitrogen and carbon instead of the amine-based gas. Also, the organic hydrazine-based gas is a gas containing a hydrazine group, such as a gas obtained by vaporizing an organic hydrazine, and a gas containing carbon (C), nitrogen (N), and hydrogen (H). That is, the organic hydrazine-based gas is a boron-free gas and a boron/metal-free gas. For example, a methylhydrazine-based gas obtained by vaporizing monomethylhydrazine [$(CH_3)HN_2H_2$, abbreviated as MMH], dimethylhydrazine [$(CH_3)_2N_2H_2$, abbreviated as DMH], trimethylhydrazine [$(CH_3)_2N_2(CH_3)H$, abbreviated as TMH], etc., or an ethylhydrazine-based gas obtained by vaporizing ethylhydrazine [$(C_2H_5)HN_2H_2$, abbreviated as EH], etc. may be preferably used as the organic hydrazine-based gas. Also, when an organic hydrazine, for example, MMH, which is in a liquid state at normal temperature and pressure, is used, the organic hydrazine which is in the liquid state is vaporized using a vaporization system, such as a vaporizer or a bubbler, and supplied as an organic hydrazine-based gas, i.e., a gas containing carbon and nitrogen (MMH gas). A gas containing an organic hydrazine compound may also be referred to simply as an organic hydrazine compound gas or an organic hydrazine gas.

(Performing a Cycle a Predetermined Number of Times)

A BCN film including a borazine ring structure may be formed on the wafer 200 to have a predetermined composition and a predetermined film thickness by performing a cycle including steps 1d to 3d described above at least once (a predetermined number of times). The cycle described above is preferably repeated a plurality of times. That is, a thickness of a BCN layer including a borazine ring structure to be formed per cycle may be set to be less than a desired thickness and the cycle may be repeated a plurality of times until the BCN film has the desired thickness.

(Second Sequence)

Figure 14:
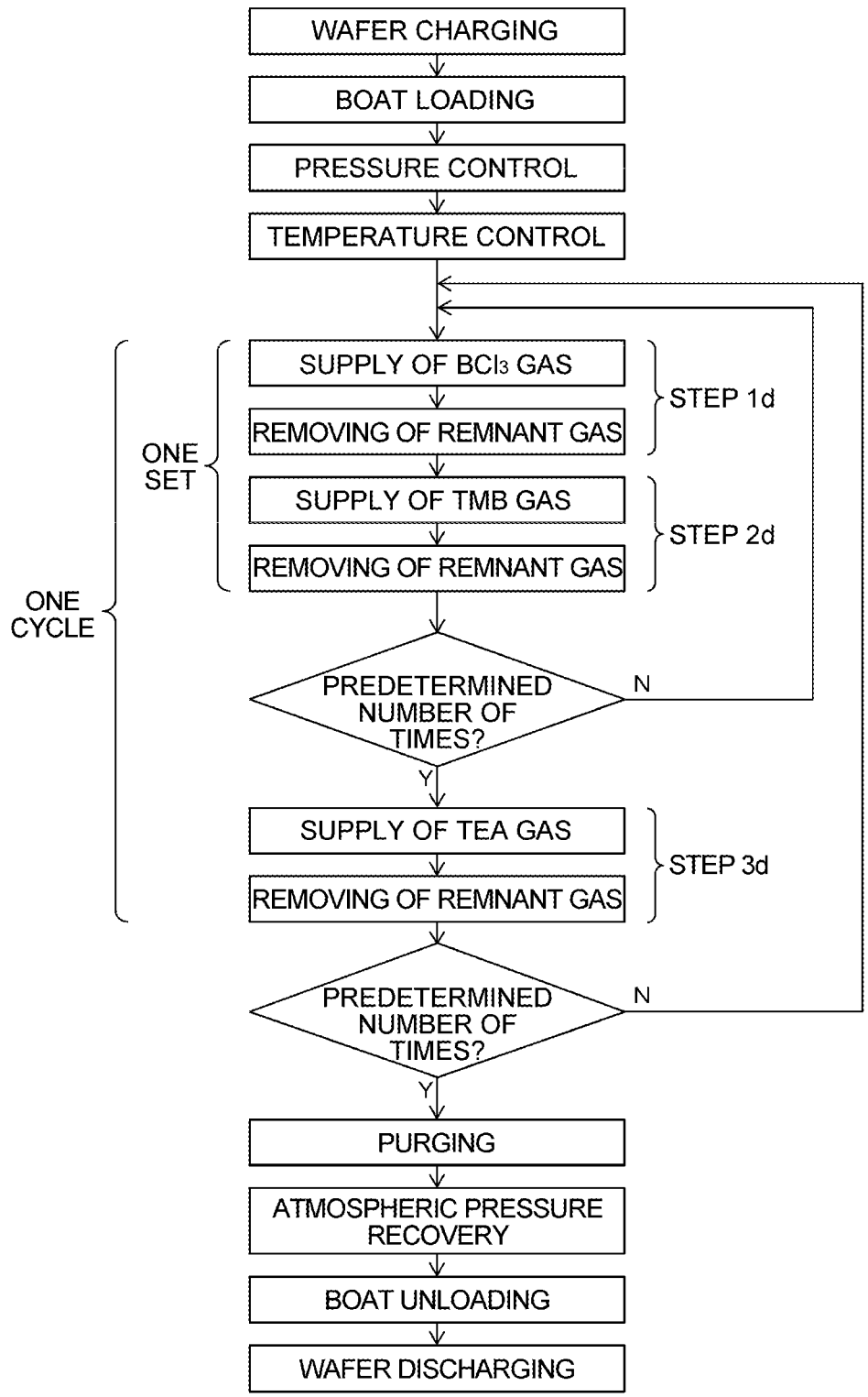
FIG. 14 is a flowchart of a film forming process in a second sequence of the fourth embodiment.

Next, a second sequence of the present embodiment will be described with reference to FIGS. 14 and 15.

In the second sequence of the present embodiment, a BCN film including a borazine ring structure is formed on a wafer 200 by performing, a predetermined number of times, a cycle including a process of alternately performing, a predetermined number of times, a process of supplying a chloroborane-based source gas ($BCl_3$ gas) as a source gas containing boron and a halogen element (Cl) to the wafer 200 and a process of supplying an organic borazine-based gas (TMB gas) as a reactive gas containing a borazine compound to the wafer 200; and a process of supplying an amine-based gas (TEA gas) as gas containing nitrogen and carbon to the wafer 200 under a condition where a borazine ring structure is retained in a borazine compound (TMB).

Figure 15A:
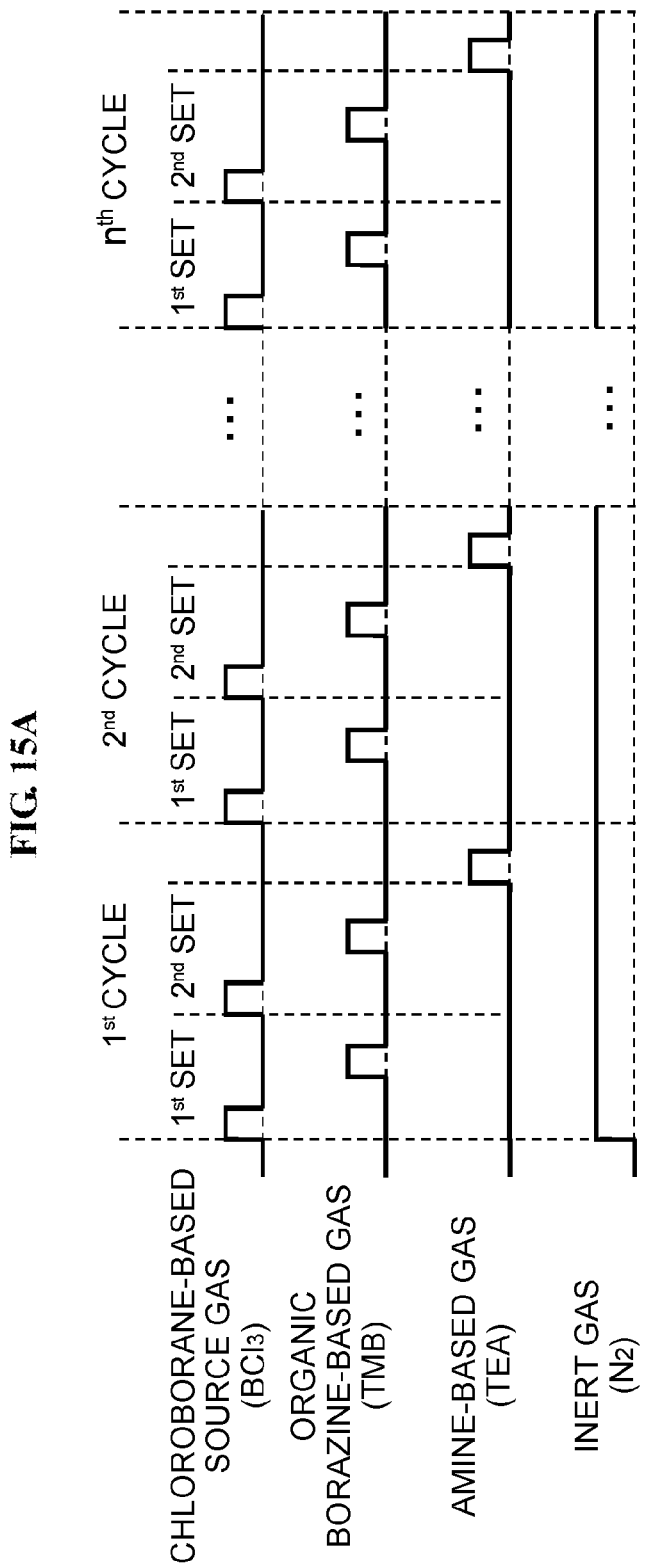
FIG. 15A is a timing chart illustrating gas supply timing in the second sequence of the fourth embodiment.

FIG. 15A illustrates a case in which a BCN film including a borazine ring structure is formed on the wafer 200 to have a predetermined composition and a predetermined film thickness by performing, n times, a cycle including performing a set including step 1d and step 2d described above twice and performing step 3d. The present sequence is the same as the first sequence except that step 3d is performed after repeating the set including step 1d and step 2d described above a plurality of times. Also, process conditions of the present sequence may be set to be the same as those in the first sequence described above.

(Effects of the Present Embodiment)

According to the film forming sequence of the present embodiment, the effects according to the previous first embodiment may also be derived. Also, according to the film forming sequence of the present embodiment, by performing step 3d, nitrogen and carbon which have been contained in the TEA gas are added to the second layer so that a BCN film in which contents of the element N and the element C are increased may be formed. Furthermore, since the TEA gas is not excited by plasma but activated by heat and supplied, an action of deintercalating (drawing) the element C from the second layer may be relatively alleviated, so it becomes easy to control a composition of the BCN film toward increasing a content of the element C in the BCN film.

Modified Example

Figure 15B:
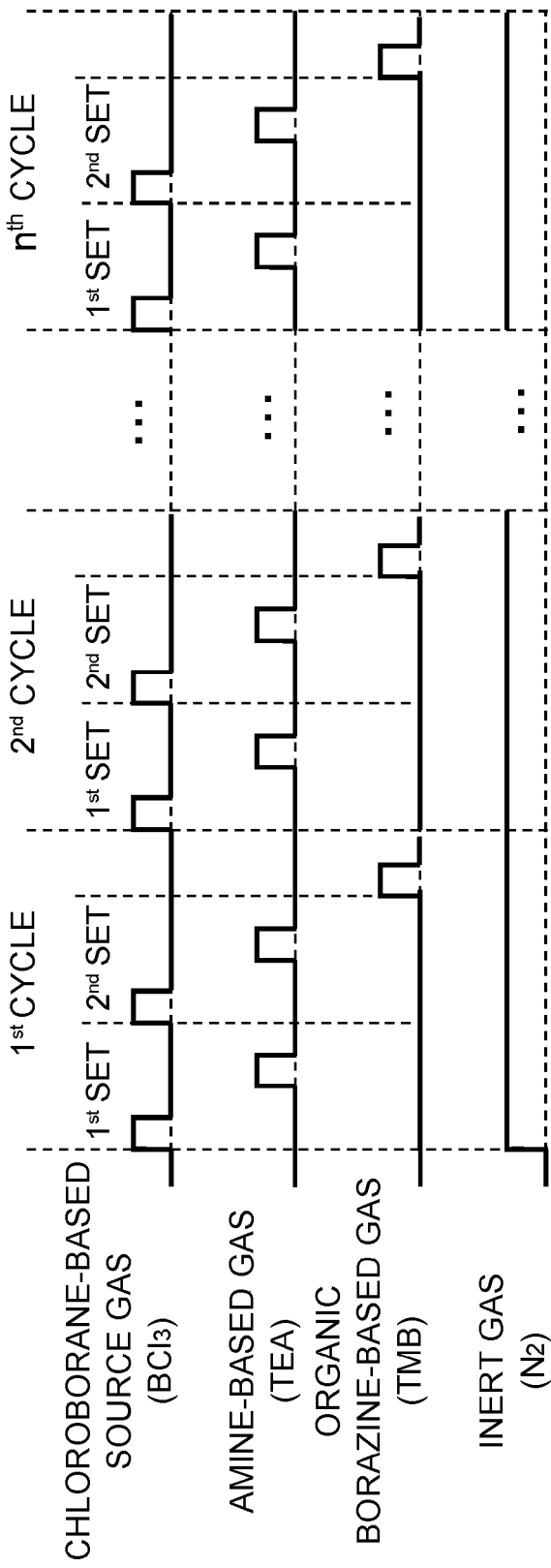
FIG. 15B illustrates a modified example of the timing chart of FIG. 15A.

Although the previous first and second sequences have been described as cases in which step 3d of supplying TEA gas is performed after step 2d of supplying TMB gas is performed, the present embodiment is not limited thereto. That is, step 3d may be performed before step 2d. FIG. 13B illustrates a case in which a cycle including performing step 1d, step 3d, and step 2d in sequential order is performed at least once (a predetermined number of times). Also, FIG. 15B illustrates a case in which a cycle including repeating a step including step 1d and step 3d a plurality of times and performing step 2d is performed a predetermined number of times.

By performing step 3d after step 1d, the first layer formed in step 1d reacts with TEA gas. Thus, the first layer is changed (modified) into a layer containing boron, chlorine, carbon, and nitrogen (a chlorine-containing BCN layer). Also, the chlorine-containing BCN layer is, for example, a layer having a thickness of less than one atomic layer to several atomic layers. Furthermore, the chlorine-containing BCN layer is a layer having relatively high contents of the element B and the element C, i.e., is both a B-rich layer and a C-rich layer.

By performing step 2d after step 3d, the chlorine-containing BCN layer formed in step 3d reacts with the TMB gas. Thus, the chlorine-containing BCN layer is changed (modified) into a second layer including a borazine ring structure and containing boron, carbon, and nitrogen, i.e., a BCN layer including a borazine ring structure.

Accordingly, a BCN film including a borazine ring structure may be formed on the wafer 200 to have a predetermined composition and a predetermined film thickness by performing, a predetermined number of times, a cycle including performing step 1d, step 3d, and step 2d in sequential order or by performing, a predetermined number of times, a cycle including repeating a set including step 1d and 3d a plurality of times and performing step 2d.

Other Embodiments of the Present Invention

While the embodiments of the present invention have been described above in detail, the present invention is not limited thereto, and various changes may be made therein without departing from the spirit of the invention.

For example, when the BCN film is formed on the wafer 200 in the previous embodiments, a process of supplying $C_3H_6$ gas may be performed during at least one of the process of supplying $BCl_3$ gas, the process of supplying TMB gas, the process of supplying $NH_3$ gas, and the process of supplying TEA gas. Thus, it becomes easy to increase the element C in the BCN film.

When the process of supplying $C_3H_6$ gas is performed during the process of supplying $BCl_3$ gas, the supply of the $C_3H_6$ gas may be performed for at least a portion of a period during which the $BCl_3$ gas is supplied, for a period during which the supply of the $BCl_3$ gas is stopped (a period before the supply of the $BCl_3$ gas is started and/or a period after the supply of the $BCl_3$ is stopped), or for both of them. When the process of supplying the $C_3H_6$ gas is performed during the process of supplying the TMB gas, the supply of the $C_3H_6$ gas may be performed for at least a portion of a period during which the TMB gas is supplied, for a period during which the supply of the TMB gas is stopped, or for both of them. Also, when the process of supplying the $C_3H_6$ gas is performed during the process of supplying the $NH_3$ gas, the supply of the $C_3H_6$ gas may be performed for at least a portion of a period during which the $NH_3$ gas is supplied, for a period during which the supply of the $NH_3$ gas is stopped, or for both of them. Furthermore, when the process of supplying the $C_3H_6$ gas is performed during the process of supplying the TEA gas, the supply of the $C_3H_6$ gas may be performed for at least a portion of a period during which the TEA gas is supplied, for a period during which the supply of the TEA gas is stopped, or for both of them.

However, performing the supply of the $C_3H_6$ gas during the supply of the TMB gas, the supply of the $NH_3$ gas, or the supply of the TEA gas is more preferable than performing the supply of the $C_3H_6$ gas during the supply of the $BCl_3$ gas because a vapor reaction between the $BCl_3$ gas and the $C_3H_6$ gas may be avoided in the process chamber 201. That is, performing the supply of the $C_3H_6$ gas during the supply of the TMB gas, the supply of the $NH_3$ gas, or the supply of the TEA gas is more preferable than performing the supply of the $C_3H_6$ gas during the supply of the $BCl_3$ gas because generation of particles may be inhibited in the process chamber 201.

In addition, performing the supply of the $C_3H_6$ gas during the supply of the TMB gas or the supply of the TEA gas is more preferable than performing the supply of the $C_3H_6$ gas during the supply of the $NH_3$ gas because it is easy to increase a content of the element C in a BCN film. That is, performing the supply of the $C_3H_6$ gas during the supply of the TMB gas or the supply of the TEA gas is more preferable than performing the supply of the $C_3H_6$ gas during the supply of the $NH_3$ gas because the controllability of a content ratio of the BCN film may be increased.

For example, although the previous embodiments have been described as cases in which a chloroborane-based source gas is used to form a first layer in each sequence, a borane-based source gas including halogen-based ligands other than a chloro group may be used instead of the chloroborane-based source gas. For instance, a fluoroborane-based source gas may be used instead of the chloroborane-based source gas. Here, the fluoroborane-based source gas means a fluoroborane-based source in a liquid state, for example, a gas obtained by vaporizing a fluoroborane-based source that is in a liquid state at normal temperature and pressure, or a fluoroborane-based source that is in a gas state at normal temperature and pressure. Also, the fluoroborane-based source is a borane-based source containing a fluoro group as a halogen group and means a source containing at least boron (B) and fluorine (F). Here, the fluoroborane-based source may be understood as a type of halide. For example, a boron fluoride gas, such as boron trifluoride ($BF_3$) gas or a diboron tetrafluoride ($B_2F_4$) gas, may be used as the fluoroborane-based source gas. In this case, when the first layer is formed in each sequence, a fluoroborane-based source gas is supplied to the wafer 200. In this case, the first layer is a layer containing boron (B) and fluorine (F), i.e., a boron-containing layer including fluorine.

In the previous embodiments, a case in which one kind of thin film (single film) is formed on the wafer 200 in each sequence at once has been described. However, a stacked film including at least two thin films may be formed on the wafer 200 at once by appropriately combining the respective sequences described above. For example, a stacked film obtained by alternately stacking a BCN film and a BN film may be formed by alternately performing the film forming sequence of the first, third, and fourth embodiments and the sequence of the second embodiment in-situ a predetermined number of times (at least once).

A technique of forming a device having a small leak current and high processability may be provided by using a BCN film or BN formed according to the present embodiments as sidewall spacers.

A technique of forming a device having high processability may be provided by using a BCN film or BN film formed according to the present embodiments as a hard mask or an etch stopper.

According to the present embodiments, a BCN film or BN film having an ideal stoichiometric ratio may be formed even in a low-temperature region without using plasma. Since the BCN film or BN film may be formed without using plasma, a film forming process may be applied to a process which may cause plasma damage, such as double patterning technology (DPT) of forming a self-aligned double patterning (SADP) film.

A plurality of process recipes (programs including process orders or conditions) are preferably individually prepared to be used to form various thin films described above according to the respective details of substrate processing (the type, composition ratio, quality, and thickness of a thin film to be formed). When substrate processing begins, an appropriate process recipe is preferably selected among the plurality of process recipes according to the details of substrate processing. In detail, the plurality of process recipes that are individually prepared according to the details of substrate processing are preferably housed (installed) in the memory device 121c included in the substrate processing apparatus beforehand via an electrical communication line or a non-transitory computer-readable recording medium (external memory device 123) storing the process recipes. Also, when substrate processing begins, the CPU 121a included in the substrate processing apparatus preferably appropriately selects a process recipe among the plurality of process recipes housed in the memory device 121c according to the details of substrate processing. Accordingly, various thin films of different types having different composition ratios, qualities, and thicknesses may be formed using one substrate processing apparatus for a general purpose and with high reproducibility. Also, a load on an operator in manipulation (a load on the operator in inputting process order or conditions, etc.) may be decreased, and substrate processing can rapidly start without causing mistakes in operation.

However, the process recipes described above are not limited to those that are newly made and may be prepared, for example, by changing a process recipe installed in the substrate processing apparatus. When the installed process recipe is changed, the changed process recipe may be installed in the substrate processing apparatus via an electrical communication line or a non-transitory computer-readable recording medium storing the changed process recipe. Otherwise, the process recipe installed in the substrate processing apparatus may be directly changed by manipulating the I/O device 122 of the substrate processing apparatus.

In the previous embodiments, cases in which a thin film is formed using a batch-type substrate processing apparatus capable of processing a plurality of substrates at once have been described above. However, the present invention is not limited thereto and is preferably applicable to a case in which a thin film is formed using a single-wafer substrate processing apparatus capable of processing one or several substrates at once. Also, in the previous embodiments, a case in which a thin film is formed using a substrate processing apparatus including a hot-wall-type process furnace has been described above. However, the present invention is not limited thereto and is preferably applicable to a case in which a thin film is formed using a substrate processing apparatus including a substrate processing apparatus including a cold-wall-type process furnace.

Also, an appropriate combination of the embodiments, modified examples, or applied examples described above may be used.

Exemplary Embodiments of the Present Invention

Exemplary embodiments of the present invention will be supplementarily described below.

According to the present invention, a thin film having a high tolerance to hydrogen fluoride (HF) and a low dielectric constant can be formed in a low-temperature region with high throughput.

(Supplementary Note 1)

According to one aspect of the present invention, there is provided a method of manufacturing a semiconductor device, including forming a thin film containing boron and a borazine ring structure on a substrate by performing a cycle a predetermined number of times under a condition where the borazine ring structure is preserved in a borazine compound, the cycle including: (a) supplying a source gas containing boron and a halogen element to the substrate; and (b) supplying a reactive gas including the borazine compound to the substrate.

(Supplementary Note 2)

In the method of Supplementary note 1, it is preferable that a first layer containing boron and the halogen element is formed in the step (a), and a second layer containing boron and the borazine ring structure is formed by reacting the first layer with the borazine compound to modify the first layer in the step (b).

(Supplementary Note 3)

In the method of Supplementary note 2, it is preferable that the step (b) includes: (b-1) reacting the halogen element included in the first layer with a ligand included in the borazine compound; (b-2) separating (drawing) the halogen element from the first layer and separating the ligand from the borazine compound after performing the step (b-1); and (b-3) binding nitrogen included in a borazine ring of the borazine compound with the boron included in the first layer after performing the step (b-2).

(Supplementary Note 4)

In the method of Supplementary note 2, it is preferable that the step (b) is performed under a condition where the halogen element included in the first layer reacts with a ligand included in the borazine compound; the halogen element is separated (drawn) from the first layer after reacting with the ligand; the ligand is separated from the borazine compound after reacting with the halogen element; and nitrogen included in a borazine ring of the borazine compound binds with the boron included in the first layer after the ligand is separated from the borazine compound.

(Supplementary Note 5)

In the method of Supplementary note 2, it is preferable that a temperature (or a pressure) of the substrate in the step (b) is a temperature whereat the halogen element included in the first layer reacts with a ligand included in the borazine compound; the halogen element is separated (drawn) from the first layer after reacting with the ligand; the ligand is separated from the borazine compound after reacting with the halogen element; and nitrogen included in a borazine ring of the borazine compound binds with the boron included in the first layer after the ligand is separated from the borazine compound.

(Supplementary Note 6)

In the method of Supplementary note 1, it is preferable that the steps (a) and (b) are alternately performed a predetermined number of times.

(Supplementary Note 7)

In the method of Supplementary note 1, it is preferable that the steps (a) and (b) are performed simultaneously.

(Supplementary Note 8)

In the method of Supplementary note 1, it is preferable that the cycle further includes (c) supplying a gas containing nitrogen and/or carbon to the substrate.

(Supplementary Note 9)

In the method of Supplementary note 1, it is preferable that the cycle further includes (d) supplying a nitriding gas to the substrate.

(Supplementary Note 10)

In the method of Supplementary note 9, it is preferable that the cycle including the steps (a), (b) and (d) are performed a predetermined number of times in a manner that the step (d) is performed after alternately performing the steps (a) and (b) a predetermined number of times in each cycle.

(Supplementary Note 11)

In the method of Supplementary note 9 or Supplementary note 10, it is preferable that the nitriding gas is thermally activated in the step (d).

(Supplementary Note 12)

In the method of Supplementary note 9 or Supplementary note 10, it is preferable that the nitriding gas is plasma-activated in the step (d).

(Supplementary Note 13)

In the method of Supplementary note 1, it is preferable that the cycle further includes (e) supplying a carbon-containing gas to the substrate.

(Supplementary Note 14)

In the method of Supplementary note 1, it is preferable that the cycle further includes (f) supplying a gas containing nitrogen and carbon to the substrate.

(Supplementary Note 15)

In the method of Supplementary note 14, it is preferable that the cycle includes the steps (a), (b) and (f) are performed a predetermined number of times in a manner that the step (f) is performed after alternately performing the steps (a) and (b) a predetermined number of times in each cycle.

(Supplementary Note 16)

In the method of any one of Supplementary notes 1 through 11 and 13 through 15, it is preferable that the cycle is performed a predetermined number of times under a non-plasma condition.

(Supplementary Note 17)

In the method of any one of Supplementary notes 1 through 16, it is preferable that the thin film contains the borazine ring structure, boron, carbon and nitrogen or contains the borazine ring structure, boron and nitrogen.

(Supplementary Note 18)

According to another embodiment of the present invention, there is provided a substrate processing method including: forming a thin film containing boron and a borazine ring structure on a substrate by performing a cycle under a condition where a borazine ring structure is preserved in a borazine compound, the cycle including: supplying a source gas containing boron and a halogen element to the substrate; and supplying a reactive gas including the borazine compound to the substrate.

(Supplementary Note 19)

According to another embodiment of the present invention, there is provided a substrate processing apparatus including: a process chamber configured to accommodate a substrate; a source gas supply system configured to supply a source gas containing boron and a halogen element into the process chamber; a reactive gas supply system configured to supply a reactive gas including a borazine compound into the process chamber; a heater configured to heat the substrate in the process chamber; a pressure regulator configured to regulate an inside pressure of the process chamber; and a control unit configured to control the source gas supply system, the reactive gas supply system, the heater and the pressure regulator to form a thin film containing boron and a borazine ring structure on the substrate by performing a cycle a predetermined number of times under a condition where the borazine ring structure is preserved in the borazine compound, the cycle including supplying the source gas to the substrate in the process chamber and supplying the reactive gas to the substrate in the process chamber.

(Supplementary Note 20)

According to another embodiment of the present invention, there is provided a non-transitory computer-readable recording medium storing a program for causing a computer to perform forming a thin film containing boron and a borazine ring structure on a substrate by performing a cycle a predetermined number of times under a condition where the borazine ring structure is preserved in a borazine compound, the cycle including: (a) supplying a source gas containing boron and a halogen element to the substrate in a process chamber; and (b) supplying a reactive gas including the borazine compound to the substrate in the process chamber.

What is claimed is:

1. A method of manufacturing a semiconductor device, comprising forming a thin film containing boron and a borazine ring structure on a substrate by performing a cycle a predetermined number of times under a condition where the borazine ring structure is preserved in a borazine compound, the cycle comprising:
   (a) supplying a source gas containing boron and a halogen element to the substrate; and
   (b) supplying a reactive gas including the borazine compound to the substrate,
   wherein a first layer containing boron and the halogen element is formed in the step (a), and a second layer containing boron and the borazine ring structure is formed by reacting the first layer with the borazine compound to modify the first layer in the step (b), and
   wherein the step (b) comprises:
      (b-1) reacting the halogen element included in the first layer with a ligand included in the borazine compound;
      (b-2) separating the halogen element from the first layer and separating the ligand from the borazine compound after performing the step (b-1); and
      (b-3) binding nitrogen included in a borazine ring of the borazine compound with the boron included in the first layer after performing the step (b-2).

2. The method of claim 1, wherein the step (b) is performed under a condition where the halogen element included in the first layer reacts with a ligand included in the borazine compound; the halogen element is separated from the first layer after reacting with the ligand; the ligand is separated from the borazine compound after reacting with the halogen element; and nitrogen included in a borazine ring of the borazine compound binds with the boron included in the first layer after the ligand is separated from the borazine compound.

3. The method of claim 1, wherein a temperature of the substrate in the step (b) is a temperature whereat the halogen element included in the first layer reacts with a ligand included in the borazine compound; the halogen element is separated from the first layer after reacting with the ligand; the ligand is separated from the borazine compound after reacting with the halogen element; and nitrogen included in a borazine ring of the borazine compound binds with the boron included in the first layer after the ligand is separated from the borazine compound.

4. The method of claim 1, wherein the steps (a) and (b) are alternately performed a predetermined number of times.

5. The method of claim 1, wherein the cycle further comprises (c) supplying a gas containing at least one selected from the group consisting of nitrogen and carbon to the substrate.

6. The method of claim 1, wherein the cycle further comprises (d) supplying a nitriding gas to the substrate.

7. The method of claim 6, wherein the cycle comprising the steps (a), (b) and (d) are performed a predetermined number of times in a manner that the step (d) is performed after alternately performing the steps (a) and (b) a predetermined number of times in each cycle.

8. The method of claim 6, wherein the nitriding gas is thermally activated in the step (d).

9. The method of claim 6, wherein the nitriding gas is plasma-activated in the step (d).

10. The method of claim 1, wherein the cycle further comprises (e) supplying a carbon-containing gas to the substrate.

11. The method of claim 1, wherein the cycle further comprises (f) supplying a gas containing nitrogen and carbon to the substrate.

12. The method of claim 11, wherein the cycle comprises the steps (a), (b) and (f) are performed a predetermined number of times in a manner that the step (f) is performed after alternately performing the steps (a) and (b) a predetermined number of times in each cycle.

13. The method of claim 1, wherein the cycle is performed a predetermined number of times under a non-plasma condition.

14. The method of claim 1, wherein the thin film contains the borazine ring structure, boron, carbon and nitrogen or contains the borazine ring structure, boron and nitrogen.

15. A method of manufacturing a semiconductor device, comprising forming a thin film containing boron and a borazine ring structure on a substrate by performing a cycle a predetermined number of times under a condition where the borazine ring structure is preserved in a borazine compound, the cycle comprising:
   (a) supplying a source gas containing boron and a halogen element to the substrate; and
   (b) supplying a reactive gas including the borazine compound to the substrate,
   wherein the steps (a) and (b) are performed simultaneously.

16. A non-transitory computer-readable recording medium storing a program for causing a computer to perform forming a thin film containing boron and a borazine ring structure on a substrate by performing a cycle a predetermined number of times under a condition where the borazine ring structure is preserved in a borazine compound, the cycle comprising:
   (a) supplying a source gas containing boron and a halogen element to the substrate in a process chamber; and
   (b) supplying a reactive gas including the borazine compound to the substrate in the process chamber,
   wherein a first layer containing boron and the halogen element is formed in the step (a), and a second layer containing boron and the borazine ring structure is formed by reacting the first layer with the borazine compound to modify the first layer in the step (b), and
   wherein the step (b) comprises:
      (b-1) reacting the halogen element included in the first layer with a ligand included in the borazine compound;
      (b-2) separating the halogen element from the first layer and separating the ligand from the borazine compound after performing the step (b-1); and (b-3) binding nitrogen included in a borazine ring of the borazine compound with the boron included in the first layer after performing the step (b-2).

\* \* \* \* \*